United States Patent
Grosjean

(10) Patent No.: US 9,945,894 B2
(45) Date of Patent: Apr. 17, 2018

(54) ARC FAULT DETECTION

(71) Applicant: Innovative Scientific Solutions, Inc., Dayton, OH (US)

(72) Inventor: Dennis F. Grosjean, Beavercreek, OH (US)

(73) Assignee: INNOVATIVE SCIENTIFIC SOLUTIONS, INC., Dayton, OH (US)

( * ) Notice: Subject to any disclaimer, the term of this patent is extended or adjusted under 35 U.S.C. 154(b) by 1072 days.

(21) Appl. No.: 13/770,382

(22) Filed: Feb. 19, 2013

(65) Prior Publication Data

US 2013/0226479 A1     Aug. 29, 2013

Related U.S. Application Data

(60) Provisional application No. 61/604,829, filed on Feb. 29, 2012.

(51) Int. Cl.
*G06F 19/00*     (2018.01)
*G01R 31/02*     (2006.01)
*G01R 31/12*     (2006.01)

(52) U.S. Cl.
CPC .......... *G01R 31/024* (2013.01); *G01R 31/12* (2013.01)

(58) Field of Classification Search
CPC ...... H02H 1/0015; H02H 3/042; H01H 83/20; H01H 9/50
USPC .......................................... 702/58, 182–185
See application file for complete search history.

(56) References Cited

U.S. PATENT DOCUMENTS

| | | | |
|---|---|---|---|
| 2,116,676 A | 5/1938 | Frank et al. | |
| 3,932,735 A * | 1/1976 | Giras | H02J 3/00 376/215 |
| 4,376,243 A | 3/1983 | Renn et al. | |
| 5,373,241 A | 12/1994 | Ham, Jr. et al. | |
| 5,477,150 A | 12/1995 | Ham, Jr. et al. | |
| 5,729,145 A | 3/1998 | Blades | |
| 6,259,996 B1 | 7/2001 | Haun et al. | |
| 6,373,257 B1 | 4/2002 | Macbeth et al. | |
| 6,567,759 B2 | 5/2003 | Dollar, II | |
| 6,633,824 B2 | 10/2003 | Dollar, II | |
| 6,772,077 B1 | 8/2004 | Parker et al. | |
| 6,839,208 B2 | 1/2005 | Macbeth et al. | |
| 6,943,558 B2 | 9/2005 | Hale et al. | |
| 6,972,572 B2 | 12/2005 | Mernyk et al. | |
| 6,980,407 B2 | 12/2005 | Kawate et al. | |
| 7,009,406 B2 | 3/2006 | Naidu et al. | |
| 7,023,196 B2 | 4/2006 | Khan et al. | |
| 7,035,066 B2 | 4/2006 | McMahon et al. | |
| 7,038,897 B2 | 5/2006 | Csakny et al. | |

(Continued)

OTHER PUBLICATIONS

Aihua, D., et al.; "Study on Electric Arc's On-line Detection and Warning System for Low Voltage Distribution Box;" IEEE; 2010; pp. 253-256.

(Continued)

*Primary Examiner* — Edward Raymond
(74) *Attorney, Agent, or Firm* — McClure, Qualey & Rodack, LLP

(57) ABSTRACT

The present disclosure provides systems and methods for detecting arc faults. For some embodiments, arc faults are detected from waveforms that are acquired and processed, preferably using an Average Magnitude Difference Function (AMDF). The characteristics of the waveform provide an indication of whether or not an arcing fault occurred.

17 Claims, 18 Drawing Sheets

(56) References Cited

U.S. PATENT DOCUMENTS

| | | | |
|---|---|---|---|
| 7,062,388 | B2 | 6/2006 | Rivers, Jr. et al. |
| 7,068,045 | B2 | 6/2006 | Zuercher et al. |
| 7,068,480 | B2 | 6/2006 | Wong et al. |
| 7,106,069 | B2 | 9/2006 | Kim et al. |
| 7,110,864 | B2 | 9/2006 | Restrepo et al. |
| 7,145,757 | B2 | 12/2006 | Shea et al. |
| 7,190,562 | B2 | 3/2007 | Pellon et al. |
| 7,227,729 | B2 | 6/2007 | Parker et al. |
| 7,463,037 | B2 | 12/2008 | Henson et al. |
| 7,536,914 | B2 | 5/2009 | Land, III et al. |
| 7,570,465 | B2 | 8/2009 | Beatty, Jr. et al. |
| 7,580,232 | B2 | 8/2009 | Caggiano et al. |
| 7,636,225 | B2 | 12/2009 | Potter |
| 7,806,000 | B2 | 10/2010 | Land, III et al. |
| 7,834,637 | B2 | 11/2010 | Kojori et al. |
| 2001/0029433 | A1 | 10/2001 | Scott |
| 2002/0179346 | A1 | 12/2002 | Dollar, II |
| 2004/0263183 | A1 | 12/2004 | Naidu et al. |
| 2005/0254187 | A1 | 11/2005 | Chu |
| 2005/0259369 | A1 | 11/2005 | Schmalz |
| 2006/0018060 | A1 | 1/2006 | Elms et al. |
| 2006/0072256 | A1 | 4/2006 | Miller et al. |
| 2006/0092585 | A1 | 5/2006 | Chan et al. |
| 2006/0114627 | A1 | 6/2006 | Wong |
| 2006/0181816 | A1 | 8/2006 | Pellon et al. |
| 2006/0215335 | A1 | 9/2006 | Deshpande et al. |
| 2009/0284265 | A1 | 11/2009 | Ohta et al. |
| 2010/0219838 | A1* | 9/2010 | Prabhu K ............ H02H 1/0015 324/509 |

OTHER PUBLICATIONS

Hong, C., et al.; "Series Arc Fault Detection and Implementation Based on the Short-time Fourier Transform;" IEEE; 2010; pp. 1-4.

Li, J., et al.; "New Insight into the Detection of High-Impedance Arcing Faults on DC Trolley Systems;" IEEE Transactions on Industry Applications; vol. 35; No. 5; Sep./Oct. 1999; pp. 1169-1173.

Bak, D., et al.; "3DPPS for Early Detection of Arcing Faults;" Modern Electric Power Systems; 2010; pp. 1-6.

Kumpulainen, L., et al.; "Minimizing Hazard to Personnel, Damage to Equipment, and Process Outages by Optical Arc-Flash Protection;" pp. 1-5.

Li, W.J., et al.; "Acr Fault Detection based on Wavelet Packet;" Proceedings of the Fourth International Conference on Machine Learning and Cybernetics; Aug. 2005; pp. 1783-1788.

Charytoniuk, W., et al.; "Arcing Fault Detection in Underground Distribution Networks—Feasibility Study;" IEEE Transactions on Industry Applications; vol. 36; No. 6; Nov./Dec. 2000; pp. 1756-1761.

Land, III, B.; "Sensing Switchboard Arc Faults;" IEEE Power Engineering Review; Apr. 2002; pp. 18-27.

Ma, S., et al;"Arc-Fault Recognition Based on BP Neural Network;" Third International Conference on Measuring Technology and Mechatronics Automation; 2011; pp. 584-586.

Eldin, E.S.T., et al.; "High Impedance Fault Detection in EHV Series Compensated Lines Using the Wavelet Transform;" IEEE; 2009; pp. 1-10.

Lee, W.J., et al.; "A Novel Approach for Arcing Fault Detection for Medium-/Low-Voltage Switchgear;" IEEE Transactions on Industry Applications; vol. 45; No. 4; Jul./Aug. 2009; pp. 1475-1483.

Maroni, C.S., et al.; "Series Arc Detection in Low Voltage Distribution Switchboard Using Spectral Analysis;" International Symposium on Signal Processing and its Applications; Aug. 2001; pp. 473-476.

Momoh, J.A., et al.; "Design and Analysis of Aerospace DC Arcing Faults using Fast Fourier Transformation and Artificial Neural Network;" IEEE 2003; pp. 788-793.

Naidu, M., et al.; "Arc Fault Detection Scheme for 42-V Automotive DC Networks Using Current Shunt;" IEEE Transactions on Power Electronics; vol. 21; No. 3; May 2006; pp. 633-639.

Parise, G., et al.; "Simplified Arc-Fault Model: The Gearing Pace Model;" IEEE; 2004; pp. 154-162.

Rogers, J.H., et al.; "RF Arc Detection using Harmonic Signals;" IEEE; 1995; pp. 522-525.

Roscoe, G., et al.; "Methods for Arc-Flash Detection in Electrical Equipment;" IEEE; 2010; pp. 1-8.

Ross, M.J., et al.; "Average Magnitude Difference Function Pitch Extractor;" IEEE Transactions on Acoustics, Speech, and Signal Processing; vol. ASSP-22; No. 5; Oct. 1974; pp. 353-362.

Schimpf, F., et al.; "Recognition of Electric Arcing in the DC-wiring of Photovoltaic Systems;" pp. 1-6.

Steiner, J.P.; "Partial Discharge—Part IV: Commercial PD Testing;" IEEE Electrical Insulation Magazine; vol. 7; No. 1; Jan./Feb. 1991; pp. 20-33.

Vaughan, M., et al.; "A Non-Intrusive Power System Acring Fault Location System Utilising the VLF Radiated Electromagnetic Energy;" IEEE; 2000; pp. 2443-2448.

Yunmei, G., et al.; "Wavelet Packet Analysis Applied in Detection of Low-voltage DC Arc Fault;" IEEE; 2009; pp. 4013-4016.

Zeller, M., et al.; "Add Trip Security to Arc-Flash Detection for Safety and Reliability;" IEEE; 2009; pp. 1-8.

\* cited by examiner

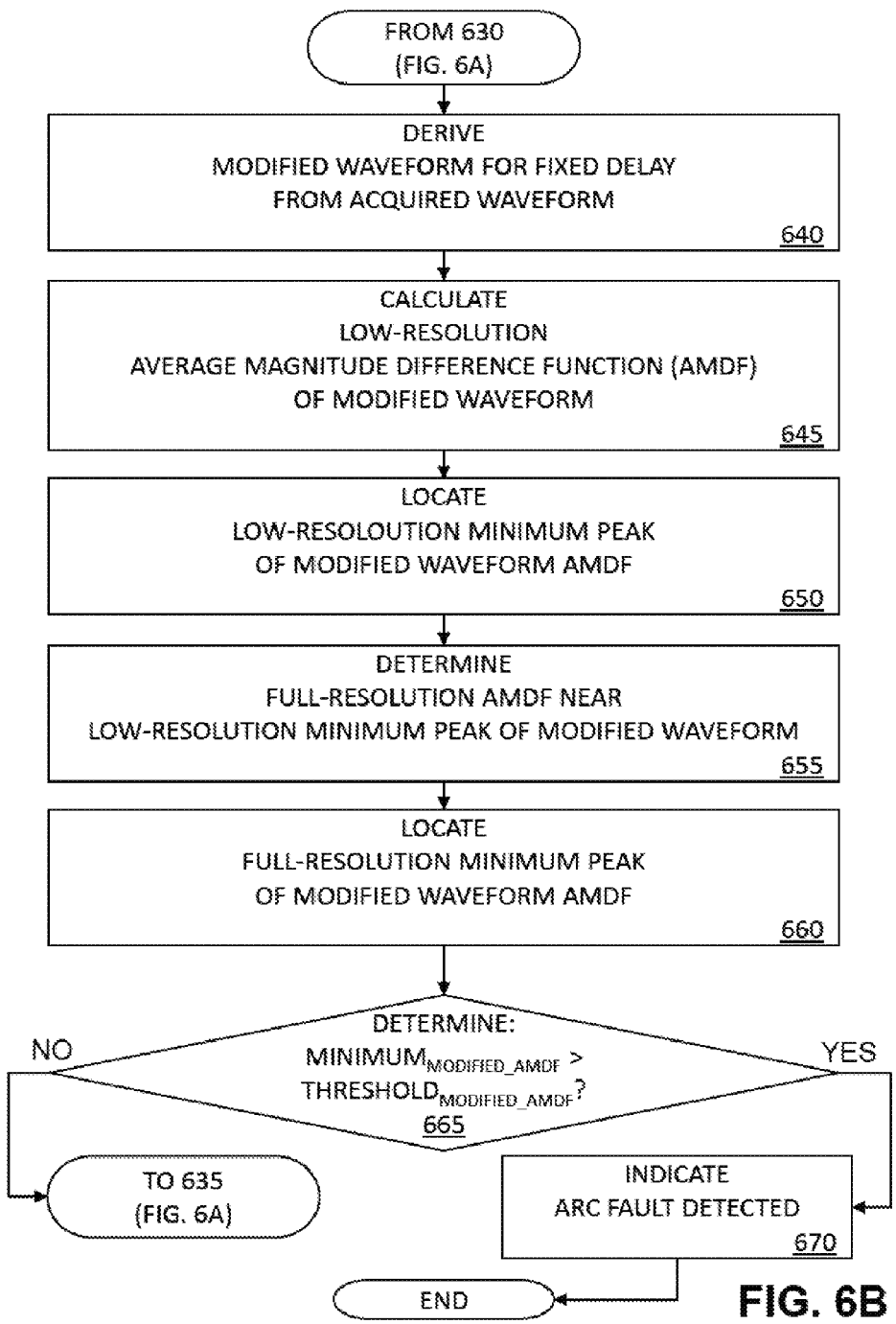

ARC FAULT DETECTION

CROSS REFERENCE TO RELATED APPLICATIONS

This application claims the benefit of U.S. provisional patent application Ser. No. 61/604,829, filed 2012 Feb. 29, having the title "Method of Arc Fault Detection," which is incorporated herein by reference in its entirety.

BACKGROUND

Field of the Disclosure

The present disclosure relates generally to arc faults and, more particularly, to systems and methods for detecting arcing faults.

Description of Related Art

Electrical arcing is the electrical discharge between two conductors. While electrical arcing can be useful, such as in arc-welding and for use in high-pressure arc lamps, undesired electrical discharges are known as arc faults. When power that is discharged by an arc is large, extensive damage can result from the discharge of energy. Additionally, even when the power discharge is small, significant damage can result if arcing occurs over an extended period of time. Thus, there are ongoing efforts to mitigate damage that is caused by arcing faults.

SUMMARY

The present disclosure provides systems and methods for detecting arc faults. For some embodiments, arc faults are detected from waveforms that are acquired and processed. The characteristics of the waveform provide an indication of whether or not an arcing fault occurred.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 6A and 6B show a flowchart of one embodiment of a method for detecting an arc fault.

DETAILED DESCRIPTION OF THE EMBODIMENTS

Figure 1A:
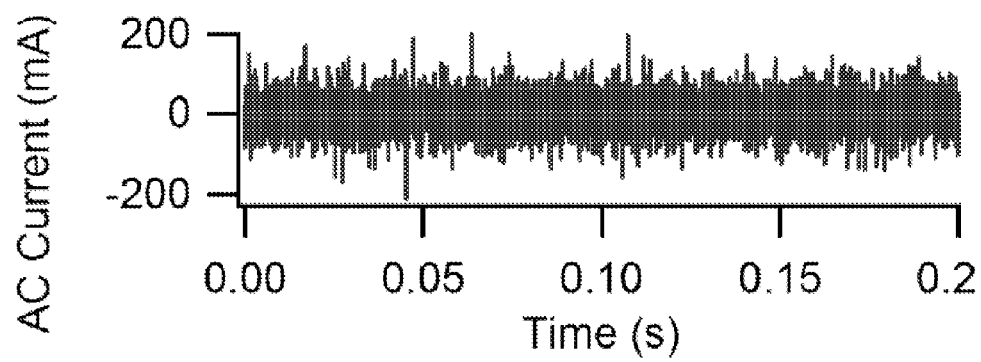
FIG. 1A is a graph showing a random noise signal having a Laplace distribution.

The phenomena of electrical arcing can be utilized in beneficial ways—for example, as a source of heat for foundry arc heaters and as a source of light in high-pressure arc lamps, etc. An electrical arc fault is an unwanted electrical discharge between two conductors. Most electrical arcs are characterized by a high localized gas temperature that is likely to cause localized physical damage. When the power dissipated within an arc is small, damage is typically minimal in the short term but may become significant over an extended period of time. When considerable power is involved, extensive damage over a wide area can occur in a relatively short period of time.

The value of a circuit device that is capable of interrupting electrical arcs has been recognized since the 1920's. For example, in 1938, W. H. Frank and L. E. Fisher patented an "Electrical Distribution System," (U.S. Pat. No. 2,116,676) for a device to minimize arc damage and extinguish arcing faults. To be useful, an arc-fault sensing device should recognize the unique characteristics of an arc in sufficient time to mitigate the consequences before extensive damage occurs. Common devices, known as an arc-fault circuit interrupters (AFCI) or arc-fault circuit breakers (AFCB), sense the characteristics of an arc and open the circuit.

Interest in arc-fault arrestors has increased because of: (1) the extent of the damage that may occur in the vicinity of the arc; and (2) advances in technology that allow for fast waveform processing in an economical, compact framework. Although many applications involve AC power distribution, the need for DC-arc mitigation is increasing because of increasing uses of high-current DC devices such as brushless DC motors and distributed photovoltaic systems.

Typically, arcs are characterized as parallel or series, depending upon their circuit location. Circuit paths of parallel arc faults (sometimes referred to as bolted faults) typically contain little electrical impedance. Thus, current can increase rapidly and reach very high levels. Because damage can be rapid, mitigation should be swift. Series arcs (sometimes referred to as simmering or sputtering arcs) are discharges that are located in series with the intended load. As such, the electrical impedance of the load will typically limit the current to values that will not trip a conventional fuse or circuit breaker. Damage resulting from a series arc usually does not occur so rapidly as damage resulting from a parallel arc. However, because the series arc may continue for a significant period of time without detection, it may cause significant damage.

The embodiments disclosed herein provide systems and methods for detecting arcing faults, thereby providing a mechanism for mitigating the effects of arcing faults. However, in order to properly understand the different inventive embodiments for detecting arc faults, it is useful to understand the principles of operation behind these arc-fault-detection systems and methods.

Figure 1B:
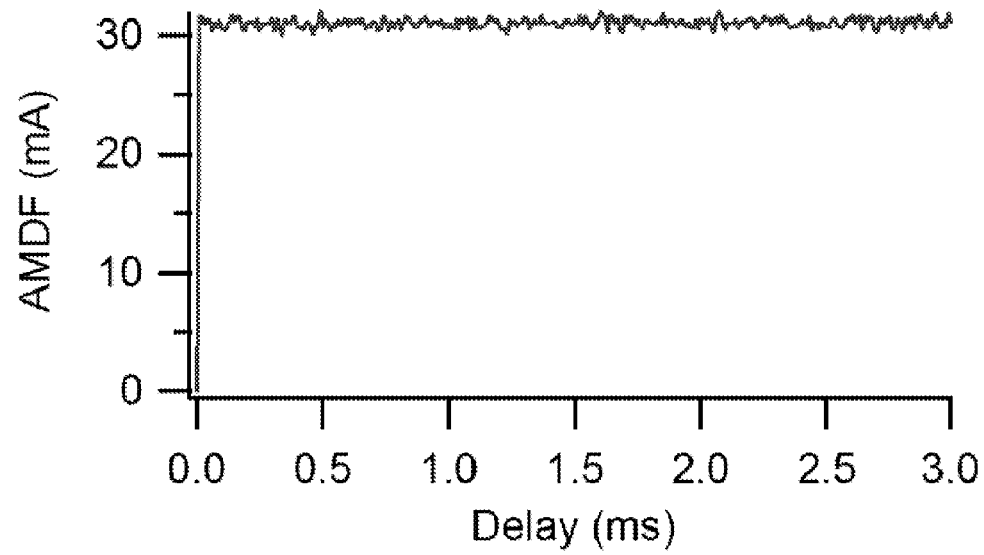
FIG. 1B is a graph showing an Average Magnitude Difference Function (AMDF) of the random noise signal of FIG. 1A.

With this in mind, attention is turned to FIG. 1A, which is a graph showing a random noise signal, and FIG. 1B, which is a graph showing an Average Magnitude Difference Function (AMDF) of the random noise signal of FIG. 1A. The AMDF is defined as:

$$AMDF(\tau_k) = \langle |X(t) - X(t - \tau_k)| \rangle \qquad \text{[Eq. 1]}$$

$$= \frac{1}{N}\sum_{j=1}^{N} |X_j - X_{j+k}| \qquad \text{[Eq. 2]}$$

where X is a waveform, < > designates an ensemble average, || indicates an absolute value, k is a time increment, $\tau_k$ is a time delay of k, N is a total number of samples summed, and the subscripts of X represent a time-bin of a digitized waveform. The value at τ=0 is zero.

As one can see from Eqs. 1 and 2, the AMDF will have a zero or positive value, and will characteristically indicate the statistical nature of a waveform. If a waveform is periodic, then the AMDF will reach a minimum at a time delay corresponding to equal phases of successive cycles. If a waveform is random, then the AMDF will be randomly distributed. If a distribution is randomly distributed about a mean value, such as a Gaussian or Laplace distribution, then the AMDF will be randomly distributed about a mean. If the waveform contains a combination of both periodicity and randomness, then the AMDF will exhibit characteristics of both. In the case of a waveform having both random and periodic components, the minimum value of the AMDF will not be less than the value that would exist if the periodic component were not present. As shown in greater detail below, the AMDF can be used as an indicator of a dominant waveform. Specifically, the first significant minimum indicates a dominant period. Also, the AMDF can be used as an indicator of random noise in the presence of periodic oscillations. In particular, the lowest amplitude of all minima indicates random noise.

By way of example, given Eqs. 1 and 2, when an AMDF is applied to the random noise signal of FIG. 1A, the result is a random distribution about an approximately-horizontal straight line. This is expected because the absolute value of a time-invariant random noise results in positive values that are randomly distributed about an ensemble average along the time-axis. As long as the noise is distributed about a mean, such as a Gaussian or Laplace distribution, statistics dictate that the ensemble average will likewise be distributed about a mean. Thus, as expected the AMDF of FIG. 1B shows an approximately-horizontal straight line (i.e., a zero-slope line). Insofar as random noise has no dominant frequency, the AMDF, as shown in FIG. 1B, exhibits no discernible minima.

Figure 2A:
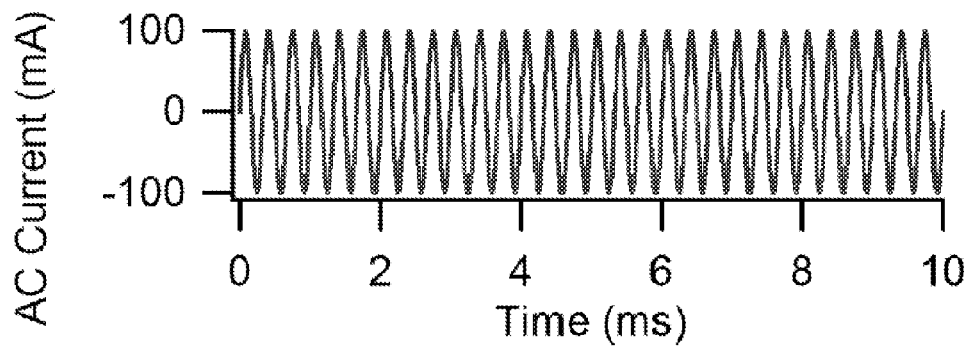
FIG. 2A is a graph showing a three (3) kilohertz (kHz) sinusoidal wave.
Figure 2B:
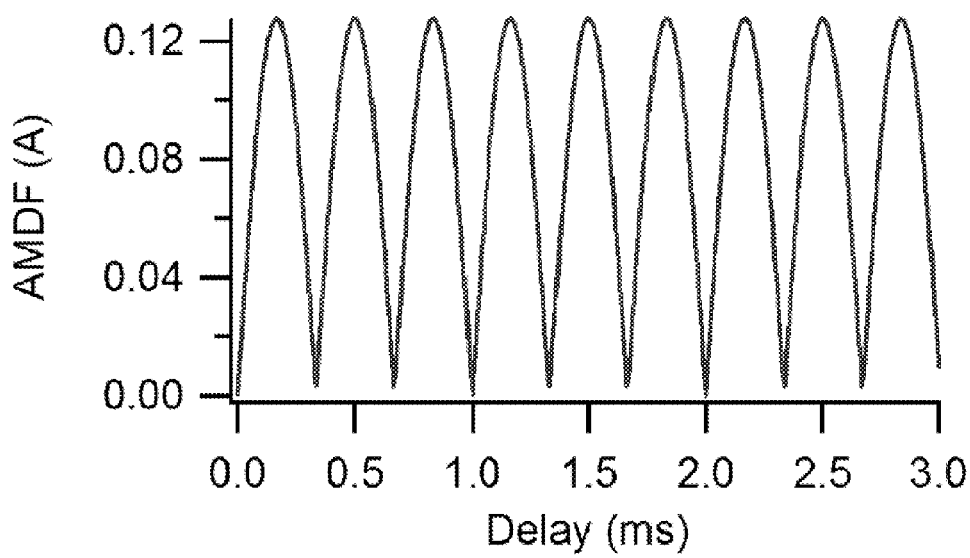
FIG. 2B is a graph showing the AMDF of the sinusoidal wave of FIG. 2A.

As the waveform or function changes, one can expect the AMDF to change correspondingly. In contrast to the random-Laplace waveform (FIG. 1A), FIG. 2A shows a three (3) kilohertz (kHz) sinusoidal wave, and FIG. 2B shows the AMDF of that sinusoidal wave. Unlike the random waveform of FIG. 1A, the sinusoid of FIG. 2A has a definite discernible frequency (i.e., 3-kHz). Again, applying Eqs. 1 and 2 results in only positive peaks along the time-axis, with minima that are located where one would expect a phase match on multiple cycles of the sine wave. As expected, those local minima that correspond to phase matches are located on the time-axis that corresponds to the dominant frequency of 3-kHz (333-μs period).

Figure 3A:
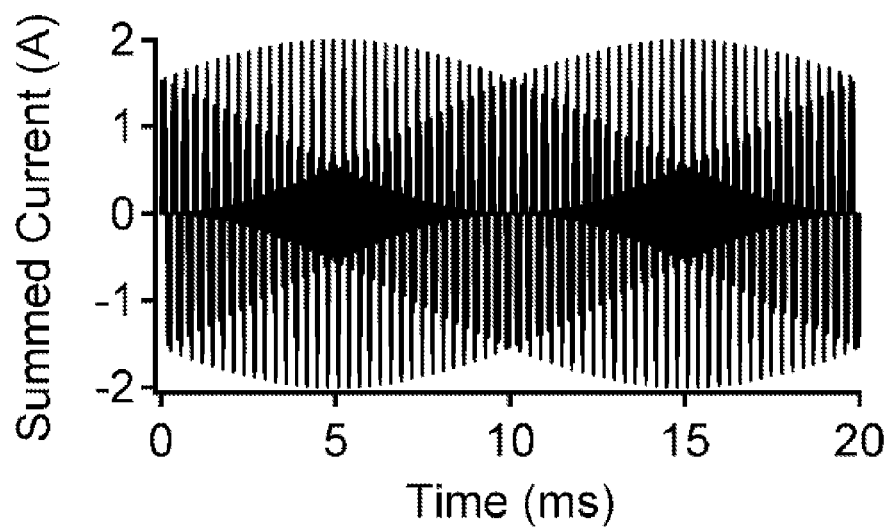
FIG. 3A is a graph showing a waveform of a 10-kHz sine wave superimposed onto a 3.30-kHz sine wave.
Figure 3B:
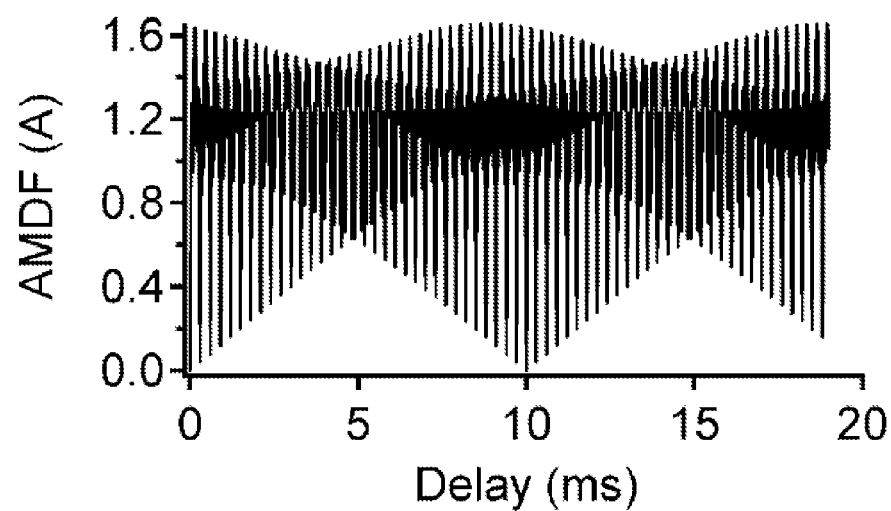
FIG. 3B is a graph showing the AMDF of the waveform of FIG. 3A.

This characteristic exhibits itself on more complicated waveforms. By way of example, FIG. 3A is a graph showing a waveform of a 10-kHz sine wave superimposed onto a 3.30-kHz sine wave, and FIG. 3B shows the AMDF of the waveform in FIG. 3A. Within an observation window of approximately 20 milliseconds (ms), the AMDF of FIG. 3B exhibits a minimum peak at 10 ms. Unfortunately, if the observation window is not sufficiently large, then it is possible for the resulting AMDF to have a minimum peak (phase match of the combined waveform) that falls outside of the observation window. This is shown with reference to FIGS. 4A, 4B, and 4C.

Figure 4A:
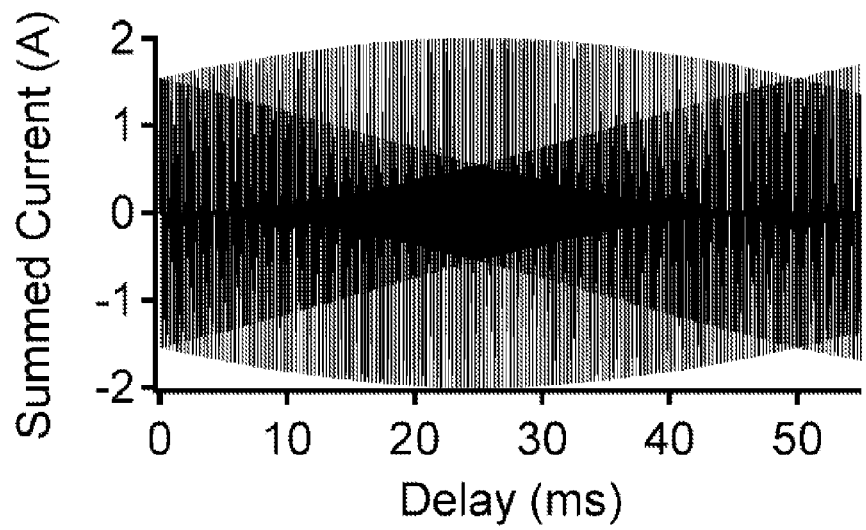
FIG. 4A is a graph showing a waveform of a 10-kHz sine wave superimposed onto a 3.34-kHz sine wave.
Figure 4B:
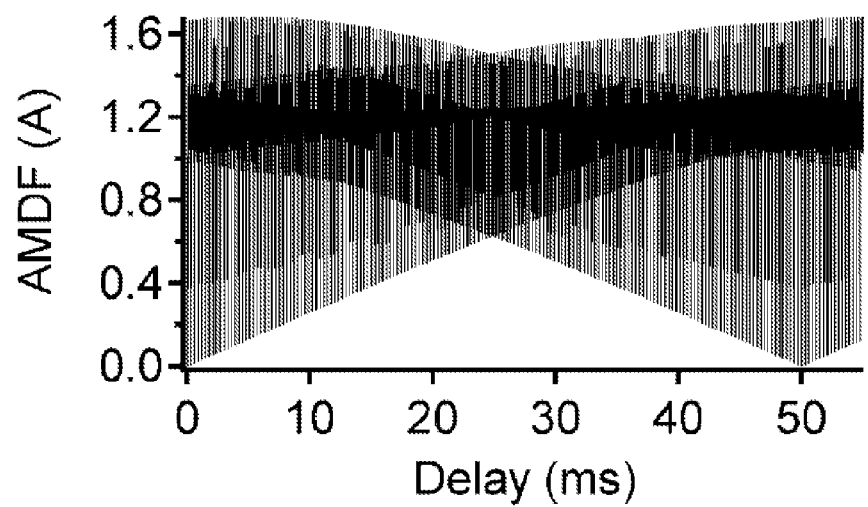
FIG. 4B is a graph showing the AMDF of the waveform of FIG. 4A with a maximum delay of 55 ms.
Figure 4C:
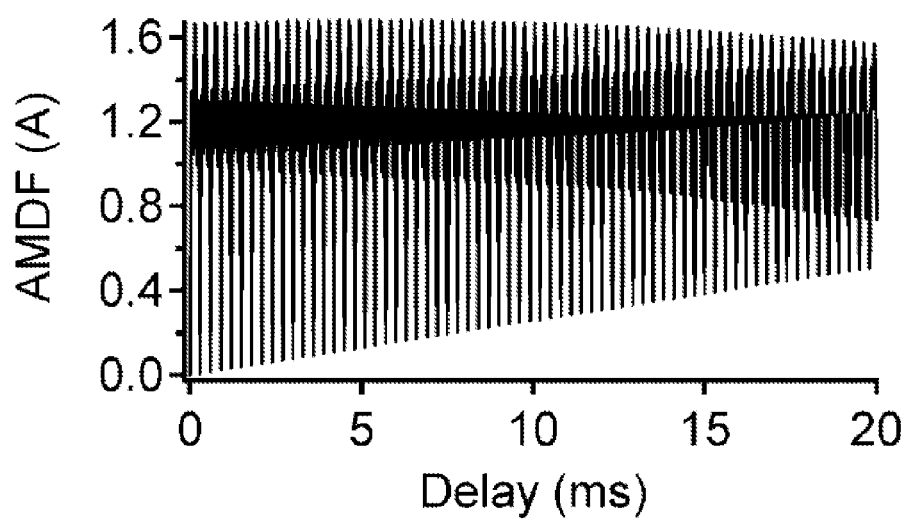
FIG. 4C is a graph showing the AMDF of the waveform of FIG. 4A with a maximum delay of 20 ms.

FIG. 4A is a graph showing a waveform of a 10-kHz sine wave superimposed onto a 3.34-kHz sine wave. As one can see, the lower-frequency waveform has only been changed by a small factor (i.e., from 3.30-kHz to 3.34-kHz). However, this small change results in the AMDF of FIG. 4B. And, as shown in FIG. 4B, the dominant minimum beyond τ=0 occurs at approximately 50 ms. If the observation window is limited to 20 ms (FIG. 4C), then the position and amplitude of the correct AMDF minimum would not be identified. In other words, there are several well-defined frequencies in FIG. 4A, and an AMDF with maximum delay <50 ms would not indicate the primary dominant period of the composite waveform. It would, however, identify a secondary period.

This problem can be mitigated by generating a modified waveform:

$$W(t)=X(t)-X(t+\delta) \qquad \text{[Eq. 3]}$$

where W(t) represents the modified waveform, X(t) represents the original time-dependent waveform, and X(t+δ) represents the original waveform with a time delay. W(t) can be represented in digital form as:

$$W_i=X_i-X_{i+m} \qquad \text{[Eq. 4]}$$

where i represents the discrete time index, and m represents the number of time-increments that correspond to an observable dominant period.

Figure 5A:
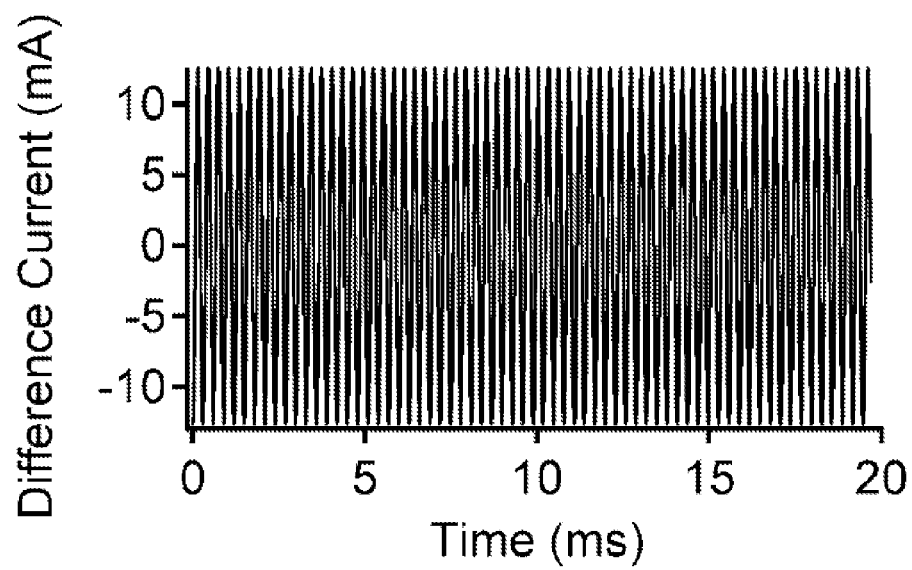
FIG. 5A is a graph showing a modified waveform, derived by applying a three-hundred (300) microsecond (µs) delay to the waveform of FIG. 4A.
Figure 5B:
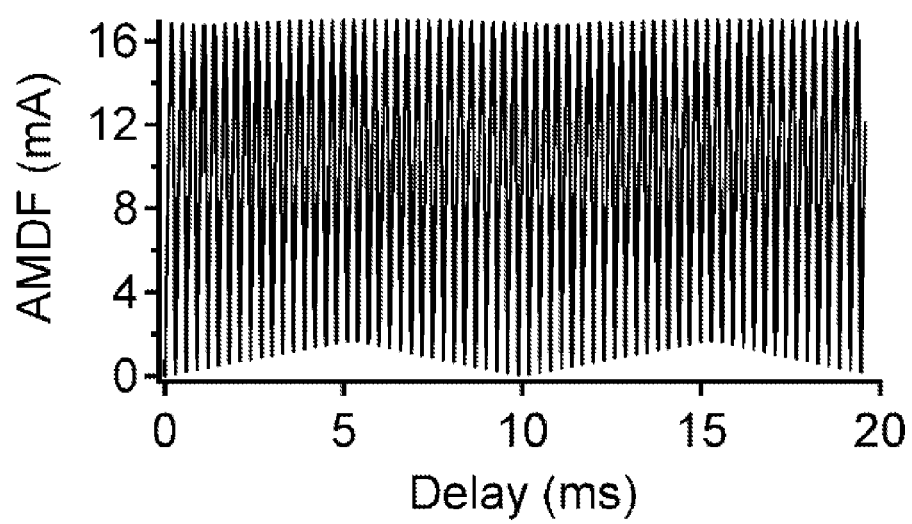
FIG. 5B is a graph showing the AMDF of the modified waveform of FIG. 5A.

Returning to FIGS. 4A, 4B, and 4C, the minimum of the combined periodic oscillations can be identified by applying Eq. 4 to the waveform of FIG. 4A to generate a time-delayed modified waveform. FIG. 5A is a graph showing the modified waveform, derived by applying a three-hundred (300) microsecond (μs) delay, identified as a secondary minimum in the AMDF of FIG. 4C, to the original waveform of FIG. 4A. The resulting AMDF of the modified waveform is shown in FIG. 5B. Since Eqs. 3 and 4 use the same waveforms, only with a fixed time-delay, the influence of a repetitive oscillation on the AMDF is minimized. In other words, the resulting AMDF provides characteristics that are more indicative of random fluctuations, and less characteristic of repetitive (or well-defined) fluctuations. Since arcing faults are typically random fluctuations, the modified AMDF as exemplified in FIGS. 3B and 5B is useful in detecting arc faults.

Given an understanding of these underlying principles, an arc-fault detector can be implemented by acquiring a waveform and processing that waveform by applying an AMDF to the acquired waveform. For some embodiments, the AMDF can be applied directly to the waveform, while in other embodiments, the original waveform is modified by a time-delay function prior to applying an AMDF. For yet other embodiments, a frequency-domain analysis can be applied to the acquired waveform to detect arcing faults. The characteristics of the waveform (original, time-delay-modified, frequency-domain, and any combination thereof) provide an indication of whether or not an arcing fault has occurred.

Having broadly described several embodiments of the invention, reference is now made in detail to the description of the embodiments as illustrated in the drawings. While several embodiments are described in connection with these drawings, there is no intent to limit the disclosure to the embodiment or embodiments disclosed herein. On the contrary, the intent is to cover all alternatives, modifications, and equivalents.

Figure 6A:
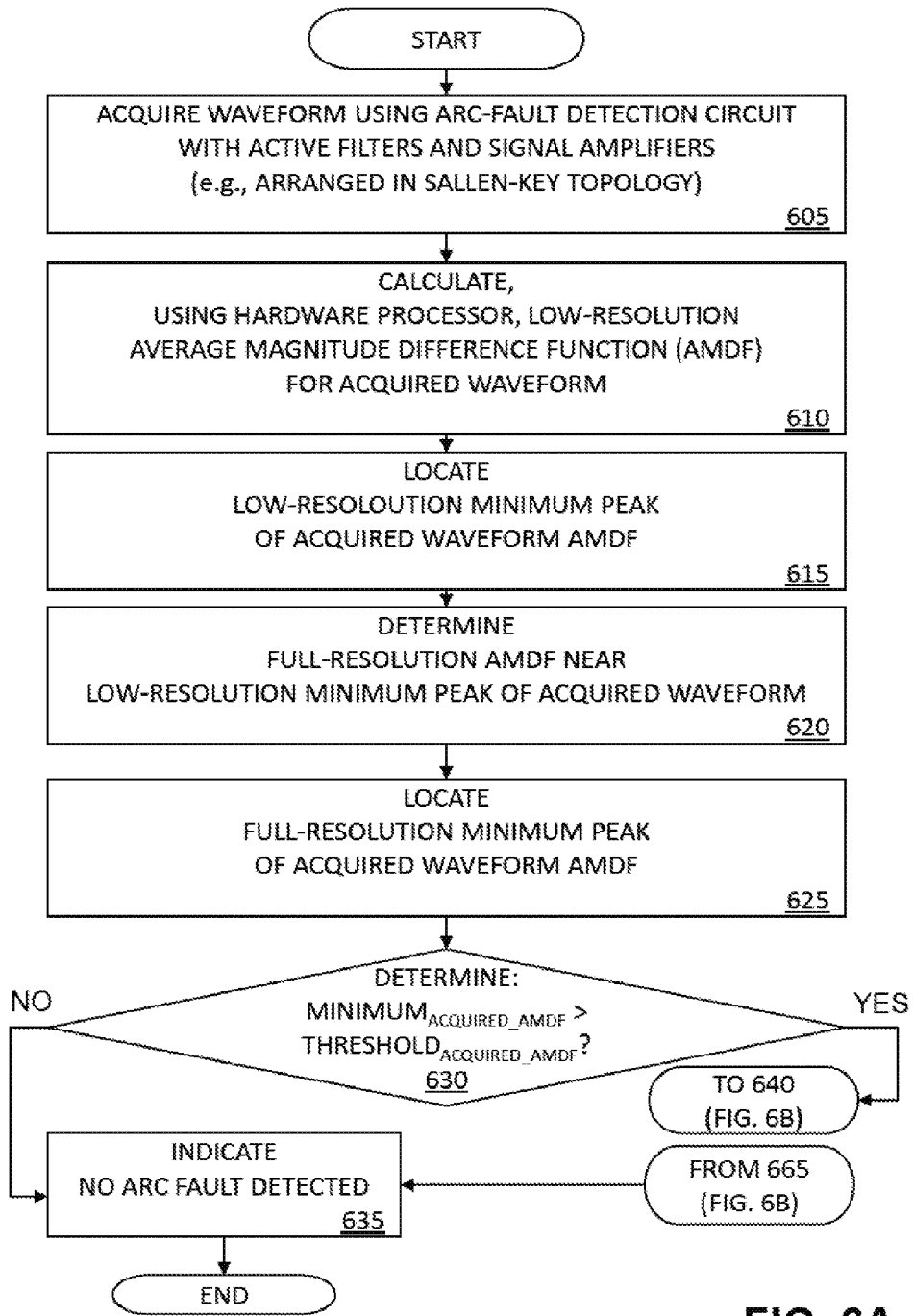

FIGS. 6A and 6B show a flowchart of one embodiment of a method for detecting an arc fault. For this embodiment, the process starts by acquiring 605 a waveform from the system of interest (e.g., brushless DC motor, distributed photovoltaic system, etc.). Typically, the waveform can be acquired 605 using an arc-fault-detection circuit with active filters and signal amplifiers arranged in, for example, a Sallen-Key topology. In other words, depending on the system being analyzed for faults, a Sallen-Key circuit with suitable components can be used for the arc-fault detection circuit. Since Sallen-Key circuits and the relevant components will be readily discernible to those having skill in the art, only a truncated discussion of such arc-detection circuits is provided herein.

By way of example, the process of FIGS. 6A and 6B can be executed by a Texas Instruments® (TI) 28335 Delfino Microcontroller, which can operate at a high clock rate and execute floating-point calculations at an average rate of less-than seven (7) nanoseconds (ns) per instruction. It should be appreciated that other processors can be employed, and that the TI processor is chosen to more-clearly explain the several embodiments disclosed herein. Also, for illustrative purposes, the embodiment of FIGS. 6A and 6B employ a 20-ms waveform comprising 4000 points attained at a digitizing rate of 200,000 samples per second (200 kS/s).

Once the waveform is acquired 605, the process calculates 610 a low-resolution Average Magnitude Difference Function (AMDF) for a predetermined period (T). Typically, many of the acquired points can be ignored for the low-resolution AMDF calculation 610. By way of example, the embodiment of FIGS. 6A and 6B uses 25 percent (%) of the acquired samples for the low-resolution AMDF calculation 610, thereby essentially reducing the digitizing rate to 25% of the actual rate. As such, the low-resolution AMDF comprises 950 points for a period that spans 0 to 19 ms ($\tau_{observation}$), and averaging is performed over 1 ms of the waveform at every fourth point. Given these numbers, the embodiment of FIGS. 6A and 6B can detect repetition periods that are less than 19 ms.

Since the AMDF comprises 950 points (maximum k) averaged over a period of 1 ms (low-resolution N=50) for an observation window of 20 ms, this results in a total of 47,500 calculations per cycle. Presuming 20 microprocessor instructions per cycle and an execution rate of approximately $150 \times 10^6$ instructions per second, the low-resolution AMDF calculation 610 consumes 6.3 ms.

As one can see from the representative numbers for FIGS. 6A and 6B, the time-period for a full-resolution AMDF calculation exceeds the acquisition period. For this reason, the embodiment of FIGS. 6A and 6B includes a low-resolution AMDF calculation 610, which employs an effective digitizing rate that is 25% of the actual digitizing rate. However, it should be appreciated that, with a faster processor, it may be possible to bypass the low-resolution AMDF calculation 610 and simply perform a full-resolution AMDF calculation.

Continuing with FIG. 6A, upon calculating 610 the low-resolution AMDF, the process next locates 615 the first dominant minimum peak (shortest period>0) for the calculated 610 low-resolution AMDF. This minimum peak represents a period at which repetitive content sums to a minimum. Thus, the remaining amplitude is the sum of any random oscillations and beat frequencies. And, these random oscillations are typically indicative of an arc.

As noted earlier, however, the located 615 minimum peak is for a low-resolution waveform that has been effectively sampled at one-quarter of the original sampling rate. The process of FIG. 6A continues by determining 620 the amplitude and the period of a full-resolution AMDF near the low-resolution minimum peak that was located 615 above. For the representative numbers above, a nine-point AMDF averaged over a 1 ms period is sufficient for the higher resolution, which yields a more-accurate result than the lower resolution. Additionally, the calculation time can be reduced further by skipping every other point, which results in an averaging step of approximately 10 μs. The period identified here is the dominant oscillation period ($\tau_{dominant}$) within the observation window ($\tau_{observation}$).

Upon determining 620 the full-resolution AMDF in the vicinity of the low-resolution minimum peak, the process locates 625 the minimum peak at the full resolution. The process then determines 630 whether or not the full-resolution minimum peak is above a predetermined threshold, such as, for example five (5) milliamps (mA). If the full-resolution minimum peak is greater than the threshold, then it is possible that there is an arc fault, and thus the process continues to FIG. 6B. On the other hand, if the full-resolution minimum peak is not greater than the threshold, then there is no arc fault, and the process indicates 635 that there is no arc fault detected.

Continuing with the process in FIG. 6B, the process next derives 640 a modified wave for a fixed delay. This modified wave is derived 640 by time-shifting the acquired 605 waveform by a fixed time-delay, in accordance with Eqs. 3 and 4. The amount of the delay is calculated from the full-resolution AMDF information. Specifically, the acquired 605 waveform is shifted by an amount that is equivalent to the dominant oscillation period, from the determination 620 of the full-resolution AMDF. This modified waveform represents variations in the acquired 605 waveform about the dominant period.

Similar to the process from FIG. 6A, the process in FIG. 6B calculates 645 the low-resolution AMDF for the modified waveform. Similar to the process above, the resolution can be limited to 25% of the actual digitizing rate, or effectively ~20 µs. However, unlike the process in FIG. 6A, the averaging step for the modified waveform should be the actual digitizing rate of ~5 µs in order to maximize the AMDF range, with 20 averaging steps (or $\tau_{averaging}$=100 µs) typically being sufficient. The AMDF range for this particular embodiment will be:

$$[0,(\tau_{observation} - \tau_{dominant} - \tau_{averaging})] \quad [\text{Eq. 5}]$$

Or, using the representative numbers from above:

$$[0,(19\text{ ms} - \{\tau_{dominant}\} - 100\text{ µs})] \quad [\text{Eq. 6}]$$

Upon calculating 645 the low-resolution AMDF of the modified waveform, the process locates 650 the absolute minimum peak from the calculated 645 low-resolution AMDF of the modified waveform. This minimum peak represents the magnitude of oscillations that remain after removing the dominant periodic oscillations. The process then determines 655 a full-resolution AMDF near the low-resolution minimum peak of the modified waveform and locates 660 the full-resolution minimum peak of the modified waveform. It should be noted that, similar to FIG. 6A, the averaging should be accomplished at full resolution, and the step size should correspond to the step size for determining 620 the full-resolution AMDF of the acquired 605 waveform. As noted above, a nine-point AMDF should be sufficient for the representative numbers that were selected for this example.

The process then determines 665 whether or not the full-resolution minimum peak (for the modified waveform) is above a predetermined threshold. This predetermined threshold may be the same as the threshold for the acquired waveform, or it may be different. If the full-resolution minimum peak is greater than the threshold, then the process has now determined that both the acquired waveform and the modified waveform have exceeded the threshold, thereby indicating 670 the existence of an arc fault. On the other hand, if the full-resolution minimum peak is not greater than the threshold, then there is no arc fault, and the process indicates 635 (FIG. 6A) that no arc fault has been detected. Once an arc-fault has been detected in accordance with the embodiment of FIGS. 6A and 6B, appropriate action can be taken to mitigate for the arc fault.

Figure 7A:
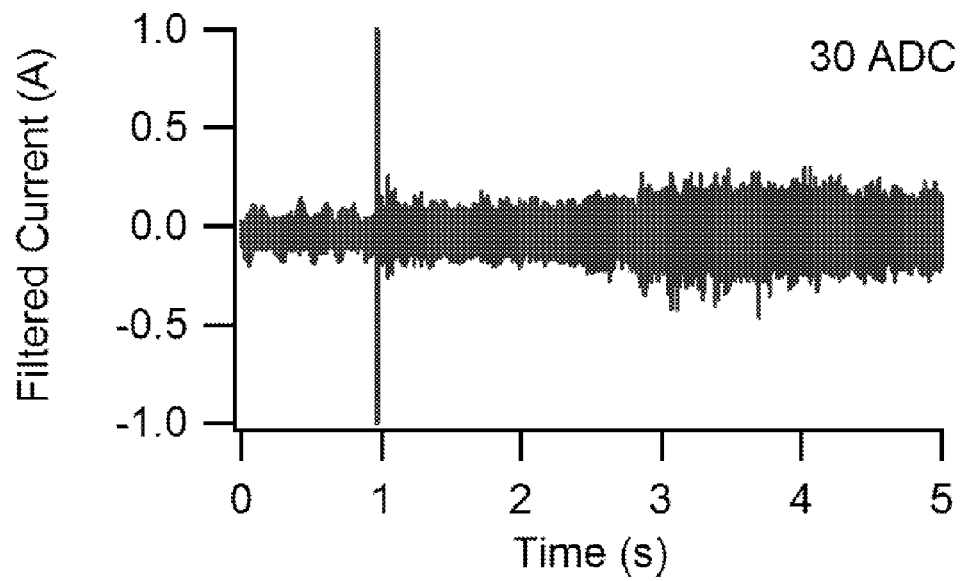
FIG. 7A is a graph showing a waveform of a pulse train with an arc initiated at approximately one (1) s.
Figure 7B:
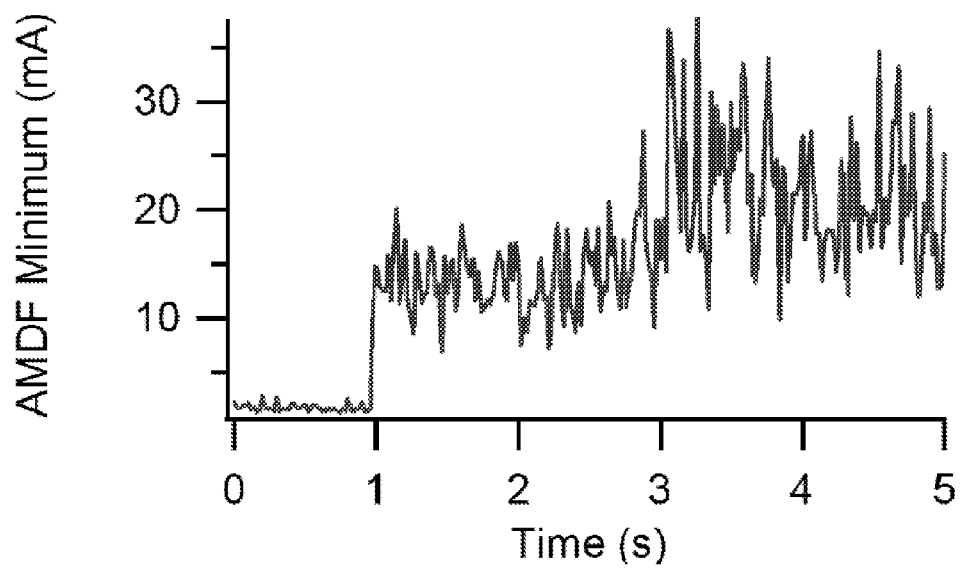
FIG. 7B is a graph showing a waveform that results after applying the arc-fault-detection method of FIGS. 6A and 6B to the waveform of FIG. 7A.
Figure 8A:
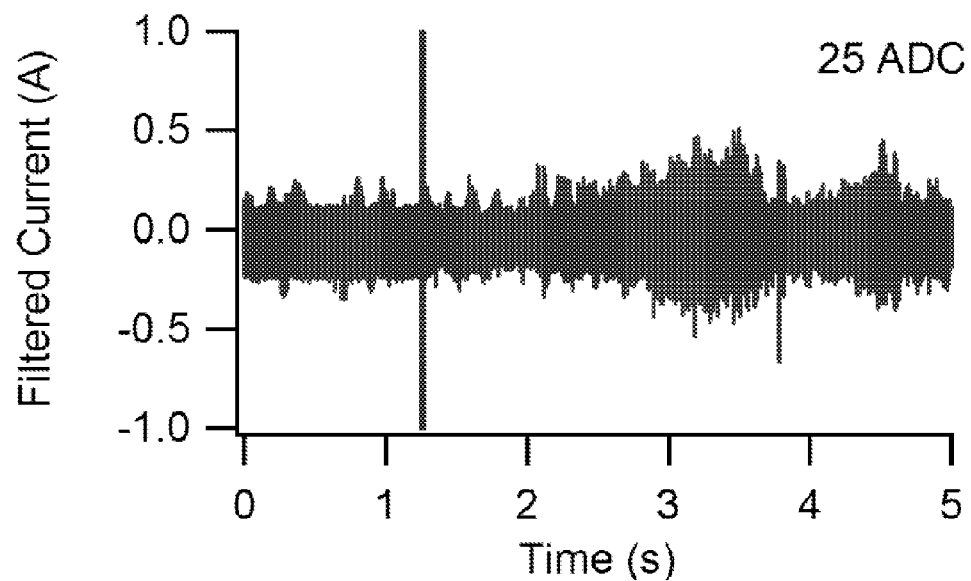
FIG. 8A is a graph showing a waveform of two superimposed pulse trains with an arc initiated at approximately 1.3-s.
Figure 8B:
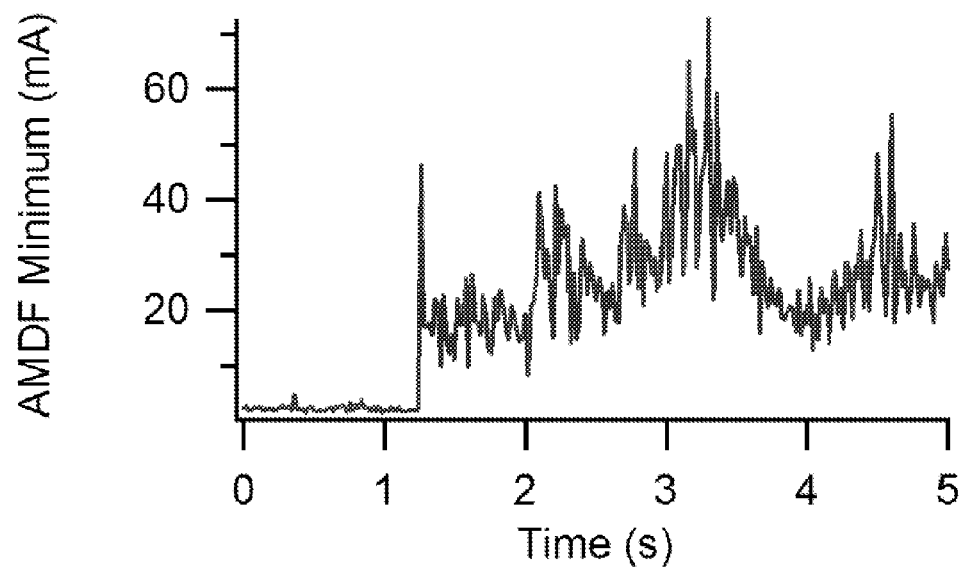
FIG. 8B is a graph showing a waveform that results after applying the arc-fault-detection method of FIGS. 6A and 6B to the waveform of FIG. 8A.

Test results for the embodiment of FIGS. 6A and 6B are shown with reference to FIGS. 7A, 7B, 8A, and 8B. Specifically, FIG. 7A is a graph showing a waveform of a pulse train with an arc initiated at approximately one (1) s; FIG. 7B is a graph showing a waveform that results after applying the arc-fault-detection method of FIGS. 6A and 6B to the waveform of FIG. 7A; FIG. 8A is a graph showing a waveform of two superimposed pulse trains with an arc initiated at approximately 1.3-s; and FIG. 8B is a graph showing a waveform that results after applying the arc-fault-detection method of FIGS. 6A and 6B to the waveform of FIG. 8A.

For one test (FIGS. 7A and 7B), a DC/DC converter system was constructed and used to superimpose fast pulses on a supply line of an arcing circuit, with the repetition frequency and pulse width being controllable. The currents in this example environment were limited to 35 Amps DC (ADC). Specifically, the circuit current was 30 ADC with a 4.5-A, 2.5-µs, 20-kHz superimposed pulse, and series arcing was introduced by electrodes separating at a constant rate. As shown in the unfiltered waveform of FIG. 7A, arcing activity began at 960 ms. The acquired waveform was then band-bass filtered with a 3-decibels (dB) cutoff frequency at 1.5 kHz and 45 kHz, which reduced the effects of high- and low-frequency components.

The result of applying the process of FIGS. 6A and 6B are shown in FIG. 7B, which shows a random noise level of less than 3 mA prior to 960 ms, even though significant noise can be seen prior to 960 ms in the original waveform of FIG. 7A. Upon the onset of the arc (at 960 ms), FIG. 7B shows a random-noise level that exceeds 6.9 mA. Thus, arc faults can be detected by setting the triggering threshold to a level greater than 5.0 mA (or some other value between 3 mA and 6.9 mA).

For another test (FIGS. 8A and 8B), the same DC/DC converter system was used, but with a 25 ADC circuit current and two simultaneous pulse trains: (a) one at 3-A, 2 µs, 10-kHz; and (b) another at 6-A, 3-µs, 3-kHz. In FIG. 8A, a series arc was introduced at ~1.3 µs. The result of applying the process of FIGS. 6A and 6B are shown in FIG. 8B. Again, the random noise level prior to arc onset (before ~1.3 µs) is relatively low, while the random noise level after series arcing (after ~1.3 µs) is relatively high. Thus, by setting the triggering threshold appropriately, the process of FIGS. 6A and 6B permit detection of arc faults.

Figure 9:
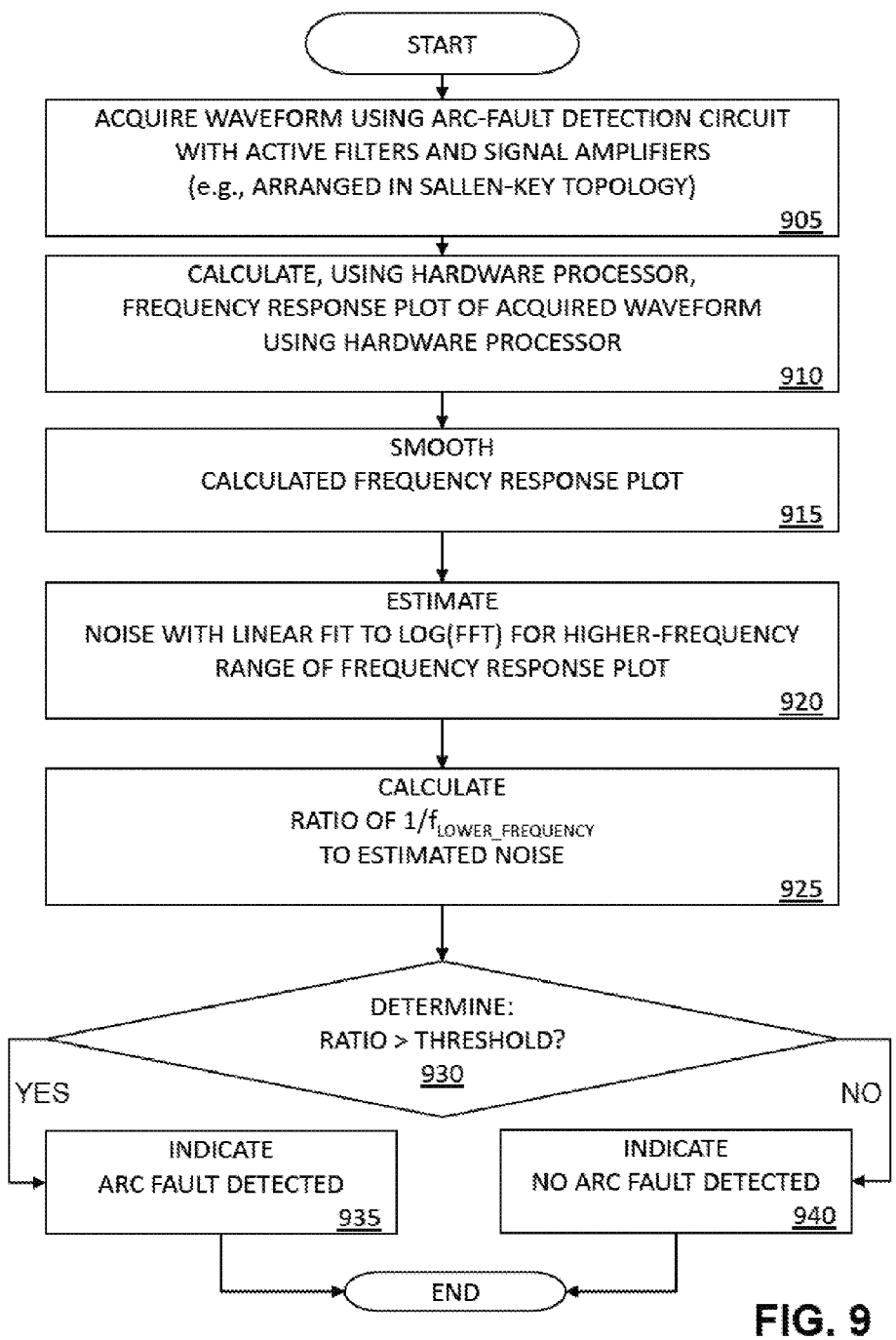
FIG. 9 shows a flowchart of another embodiment of a method for detecting an arc fault.

FIG. 9 shows a flowchart of another embodiment of a method for detecting an arc fault. As shown in FIG. 9, this embodiment of the process begins by acquiring 905 a waveform from a system that is susceptible to arcing. From the acquired 905 waveform, the process calculates 910 a frequency response. For some embodiments, the calculated 910 frequency response is a Fast Fourier Transform (FFT). However, it should be appreciated that other frequency-response calculations can be employed, such as, for example, Discrete Fourier Transforms (DFT), Laplace Transforms, Z-Transforms, or other known functions that are capable of generating a frequency-response plot from a time-domain waveform.

By way of example, if a 200-kHz digitization rate and an approximately 20-ms sample period are presumed, then a fast digital signal processor (DSP), such as a TMS320F28335 (TMS) Digital Signal Controller (DSC) with an un-optimized FFT code will complete a 4096-point FFT in approximately 20-ms. Thus, by optimizing the FFT-code by approximately 20%, this particular TMS-DSC would be able to perform the FFT within the designated time-window of about 20-ms. Alternatively, the process can extend the sample period or reducing the FFT to a 2048 points. By reducing the FFT calculation range to 2048 points, the calculation period can be reduced to 10.24 ms, and by randomly selecting the start of the calculation period, arc-detection performance will not be significantly degraded. Upon calculating 910 the frequency response plot of the acquired 905 waveform, a smoothing 915 function is applied to the frequency response plot. For some embodiments, the FFT is smoothed 915 by ±2 points.

Using this smoothed 915 frequency-response plot, the process estimates 920 the noise of the acquisition system by performing a linear curve fit to the logarithm of the frequency response (e.g., $\text{Log}_{10}(\text{FFT})$) in an area that is outside of the pass band of the active filters. For the example provided herein, where the active filters have a high-frequency cutoff of approximately 45-kHz, a baseline at approximately 80-100 kHz is an adequate band at which noise calculations can be performed. This straight-line fit is a relatively fast calculation and facilitates further analysis.

It should be pointed out that the power spectral density (PSD) of an arc is expected to have a relationship that is proportional to the reciprocal of frequency (i.e., $1/f^\beta$ typically with $\beta=1$). As such, a plot of logarithm of PSD versus logarithm of frequency (Log-Log plot) will produce a straight line with slope=−1, and an offset that is indicative of signal power. If the acquired 905 waveform is an undistorted representation of the waveform of an arc, a curve fit to the Log-Log plot of the FFT will produce a straight line; and a curve fit to a Log-linear plot will produce a relationship that is exponential in nature. However, a practical data-acquisition system will typically modify the waveform, especially in the vicinity of frequency cut-on and cut-off of a band-pass filter. As a result, it may be possible to simplify and speed up the curve-fitting calculation by performing a straight-line fit to the Log-linear plot, especially if the frequency range is small. For the example shown in this embodiment, a straight line fit is sufficient to determine a valid slope and offset (relative amplitude). Other curve-fitting relationships may be better suited to the instrument transfer function of alternative data-acquisition systems. The curve-fitting relationship need not be limited to linear but the linear relationship offers computational benefits.

Next, the process determines 925 an offset of a straight line having a slope that corresponds approximately to a 1/f distribution acquired through the pass-band filters. The frequency span for this straight-line fit is constrained within a narrow range of the pass band, typically approximately 5-40 kHz. A value of the FFT amplitude at a chosen frequency is then calculated from the straight-line fit and compared to the instrument noise 920. In other words, the ratio (of curve-fit-determined amplitude to the estimated 920 noise) provides a measure of the arc magnitude. Thus, from this calculated 925 ratio, the process determines 930 whether or not the calculated 925 ratio exceeds a predetermined threshold. And, if the ratio exceeds the predetermined threshold, then the process indicates 935 that an arc fault is detected. Conversely, if the ratio does not exceed the predetermined threshold, then the process indicates 940 that no arc fault is detected.

Figure 10A:
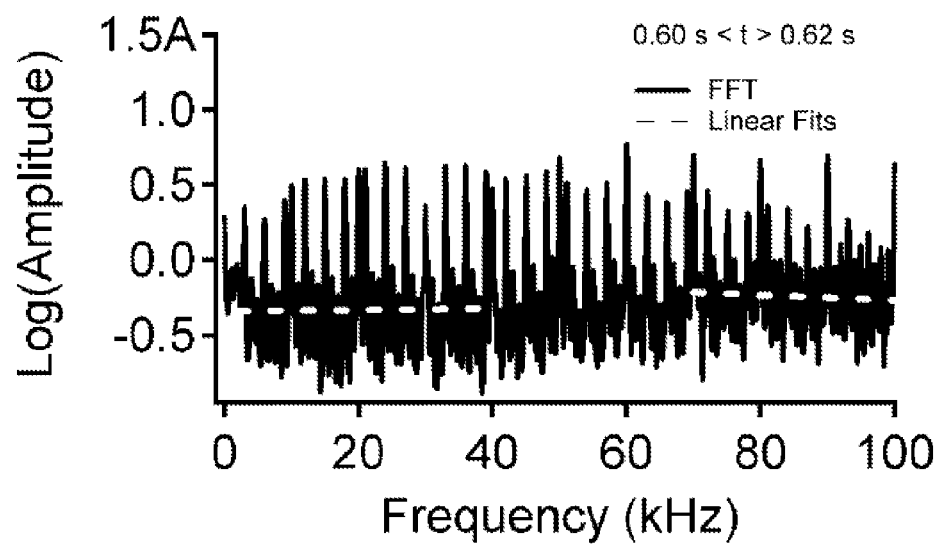
FIG. 10A is a graph showing a linear curve fit to a Fast Fourier Transform (FFT) of the waveform of FIG. 8A between approximately 0.6 seconds (s) and approximately 0.62 s.
Figure 10B:
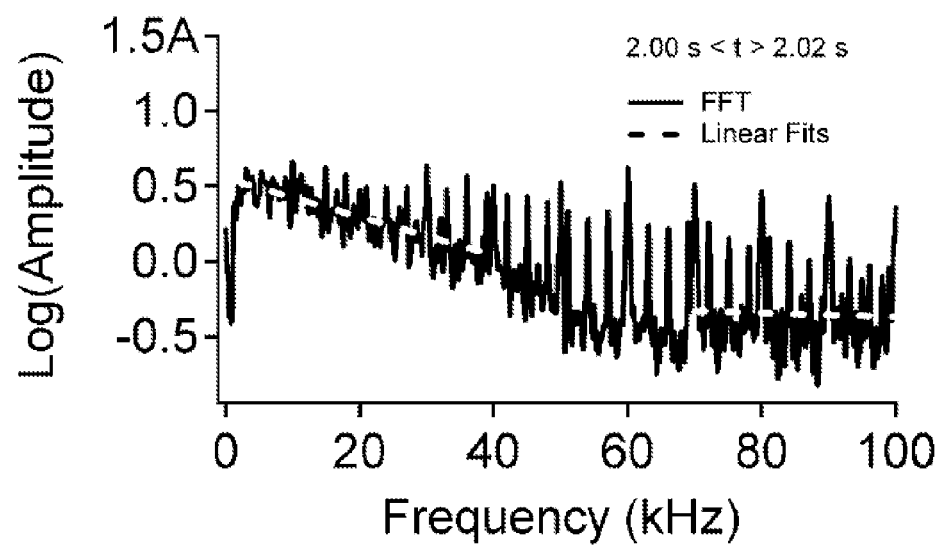
FIG. 10B is a graph showing a linear curve fit to the FFT of the waveform of FIG. 8A between approximately 2.00 s and approximately 2.02 s.
Figure 10C:
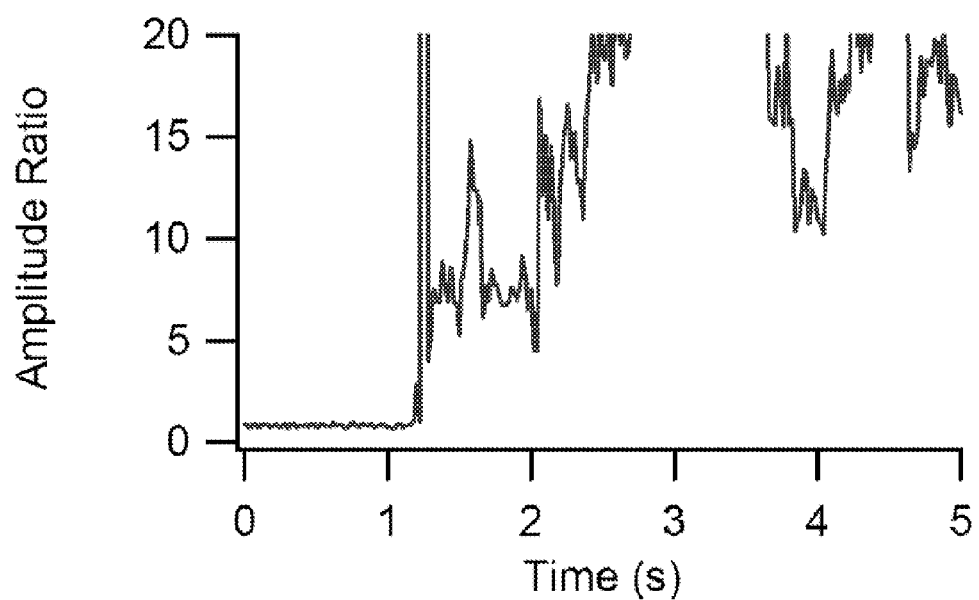
FIG. 10C is a graph showing an amplitude ratio of the curve fits at 20-kHz and at 85-kHz.

Results from a demonstration of the process of FIG. 9 are shown in FIGS. 10A, 10B, and 10C. Specifically, FIG. 10A is a graph showing a linear curve-fit to the logarithm of a Fast Fourier Transform (FFT) of the waveform of FIG. 8A between approximately 0.6 seconds (s) and approximately 0.62 s. Recalling from the description above, the period between 0.6 s and 0.62 s was devoid of an arc. As such, the average slope in the 85-kHz range (outside of the pass-band) is approximately zero (0), and similarly the average slope in the 20-kHz range (within the pass-band) is also approximately 0. In other words, in the absence of an arc-fault, both the region beyond the pass-band and the region within the pass-band exhibit a nearly-horizontal slope and approximately equal offsets.

Comparatively, FIG. 10B is a graph showing a linear curve-fit to the FFT of the waveform of FIG. 8A between approximately 2.00 s and approximately 2.02 s, which is a period after the arc-fault was triggered (arc fault triggered at ~1.3 μs). As shown in FIG. 10B, the region beyond the pass-band (at 85-kHz) still exhibits a near-zero slope. This is expected because anything significantly beyond the upper level of the pass-band (e.g., >60 kHz) is expected to be random instrumental noise, which would result in a zero-average slope. Unlike FIG. 10A, however, the graph of FIG. 10B shows that the pass-band during an arc fault has a definite slope. In other words, as shown in FIG. 10B, the average slope in the 20-kHz range (within the pass-band) exhibits a slope that approximately follows a $1/f^\beta$ function, typically with $\beta=1$. In other words, in the presence of an arc-fault, the region significantly beyond the pass-band exhibits a nearly-horizontal slope, while the region within the pass-band exhibits a slope that approximates $1/f^\beta$ when combined with the transfer function of the filter circuitry.

FIG. 10C is a graph showing an amplitude ratio calculated from values of the curve-fits at 20-kHz and at 85-kHz as determined by the curve-fits to the low- and high-frequency ranges. As shown in FIG. 10C, the calculated 925 amplitude ratio prior to arc fault (before ~1.3 s) is expectedly flat and near-one, while the calculated 925 amplitude ratio after arc-fault initiation (after ~1.3 s) exhibits non-zero, variable fluctuations. Thus, as described with reference to FIG. 9, by judiciously selecting a threshold level, the onset of an arc fault can be determined from the calculated 925 amplitude ratios.

At this point, it is worthwhile to note some of the advantages of using a process that combines AMDF and frequency-domain analysis. Specifically, measurements on operational actuators show that high-power, brushless-DC-motor drivers can place severe fluctuating current noise on a somewhat steady-state direct current (DC) power circuit. In some cases, the fluctuating current amplitude exceeds approximately 50% of the DC current. Typically, but not always, the frequency of the fluctuating component is relatively constant, while the amplitude of the fluctuating component may vary slightly over any given observation period. Due to the size of the fluctuating component, it is entirely possible for the fluctuating component to mask any low-level broadband signal of interest (e.g., an arc-fault signal). Given these characteristics, it is challenging to determine whether the frequency-dependence of the low-level noise has a 1/f dependence.

For these types of circuits, the frequency range of a broadband that is generated by an arc is extensive. However, for practical purposes, the lower end of the range is determined by external noise, such as that from 400-Hz generators. The upper end of the frequency range is often limited by, for example, transmission-line losses, available analog-to-digital (A/D) converters, and high-frequency interference. Within these two boundaries (low frequency and high frequency), it is advantageous to cover the largest possible frequency range in order to reduce the effects of discrete oscillations overshadowing broadband signals that may be indicative of an arcing fault. However, limiting the band-pass range reduces the reliability of detecting arc faults.

Figure 11A:
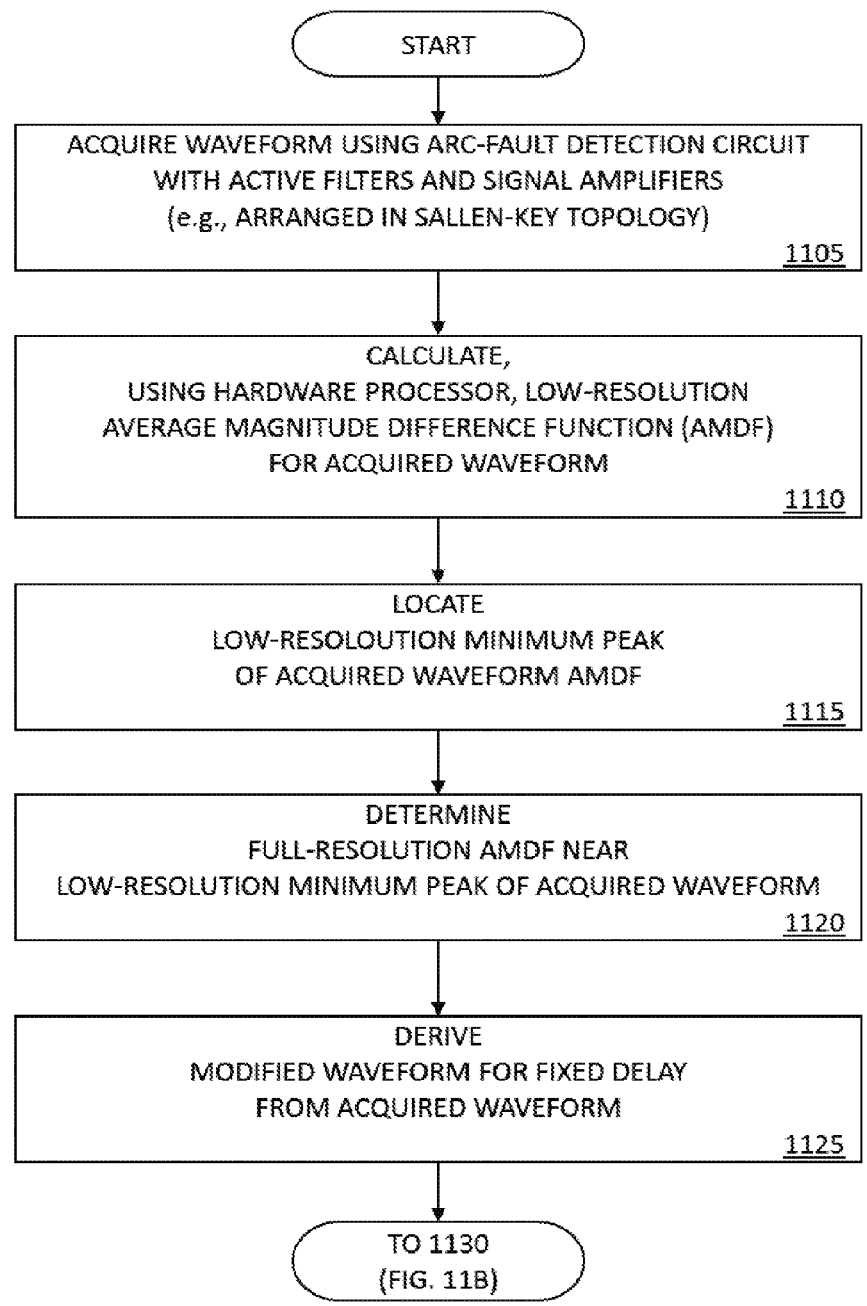
FIGS. 11A and 11B show a flowchart of yet another embodiment of a method for detecting an arc fault.
Figure 11B:
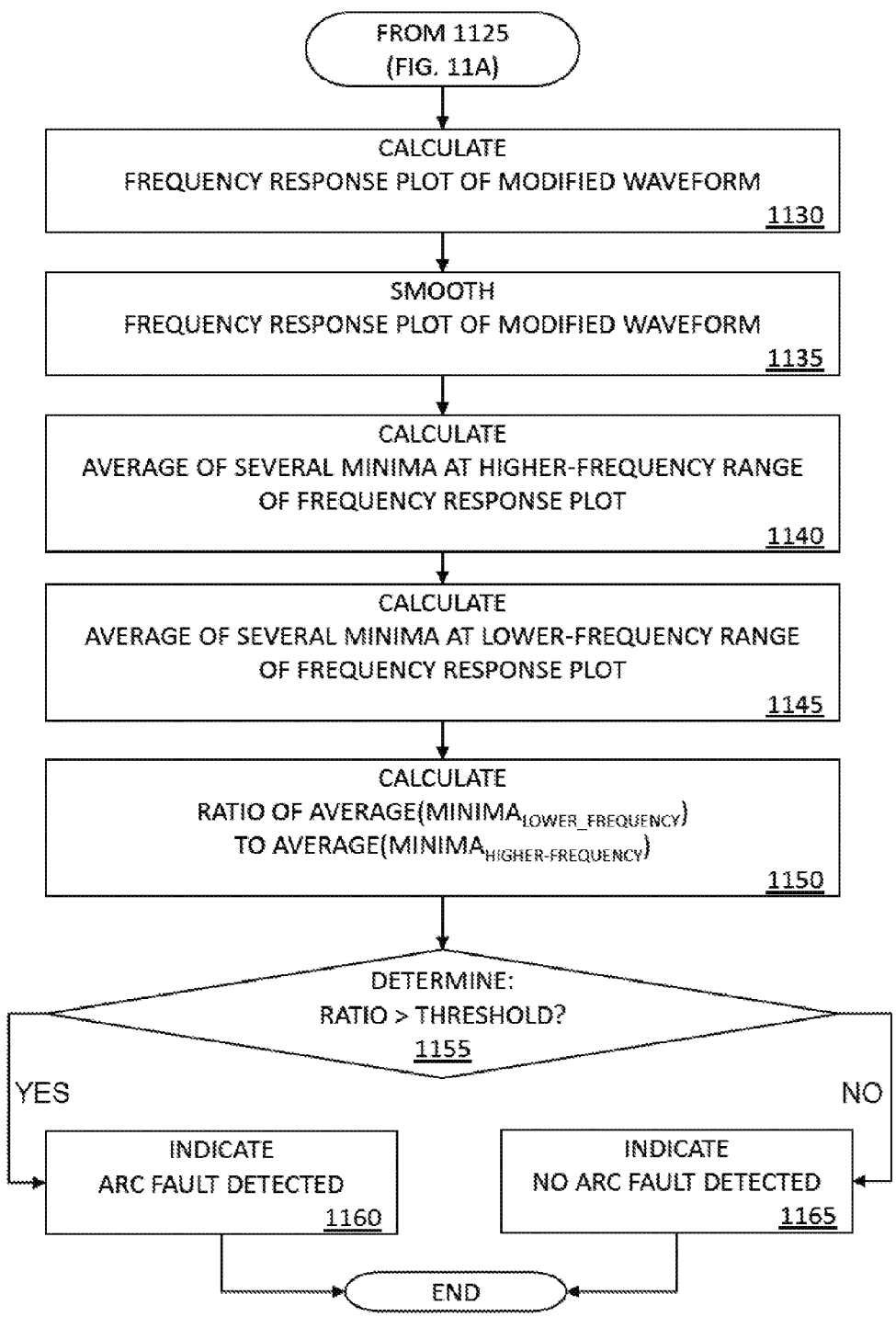

FIGS. 11A and 11B show a flowchart of yet another embodiment that combines some of the features of the AMDF process of FIGS. 6A and 6B and some of the frequency-domain (and more particularly FFT) process of FIG. 9. Similar to FIGS. 6A, 6B, and 9, the embodiment of FIG. 11A begins by acquiring 1105 a waveform from the system that is under observation for arc faults. Upon acquiring 1105 the waveform, the process calculates 1110 a low-resolution AMDF for the acquired 1105 waveform, and then locates 1115 a minimum peak for the low-resolution AMDF of the acquired 1105 waveform. Similar to the embodiment of FIG. 6A, the low-resolution AMDF can be one that is digitized at 25% of the actual digitization rate.

Again, if there is sufficient processing power, then the low-resolution AMDF can be bypassed. However, in the embodiment of FIG. 11A, the minimum peak of the low-resolution AMDF represents a period at which repetitive content sums to a minimum.

Upon locating 1115 the low-resolution minimum peak, the process determines 1120 the period for the minimum at full resolution in the vicinity of the located 1115 low-resolution minimum peak. Using this information, the process derives 1125 a modified waveform for a fixed delay. This modified waveform represents variations of the input waveform about the dominant period, as described by Eqs. 3 and 4. The process continues to FIG. 11B, which shows one embodiment that uses the frequency-response to detect arc faults.

As shown in FIG. 11B, the process calculates 1130 a frequency-response plot of the modified waveform, which for a preferred embodiment is an FFT. The frequency-response plot of the modified waveform is smoothed 1135, preferably using a ±4-point smoothing operation that facilitates further processing. The smoothed 1135 plot is then used to calculate 1140 the average of several minima in a higher-frequency range of the frequency-response plot (denoted as Average(Minima$_{HIGHER\_FREQUENCY}$)). Recall that the higher-frequency range represents a portion of the plot that is outside of the pass-band of the system (e.g. ~80-100 kHz for a pass-band of 1.5-kHz to 45-kHz) and, thus, represents random instrument noise. The process also calculates 1145 the average of several minima in a lower-frequency range of the frequency-response plot (denoted as Average(Minima$_{LOWER\_FREQUENCY}$)). Again, recall that the lower-frequency range (e.g., 5 kHz to 40-kHz for a pass-band of 1.5-kHz to 45-kHz) represents the pass-band of the system.

Once the average of these respective frequency ranges have been calculated 1140, 1145, the process calculates 1150 a ratio of Average(Minima$_{LOWER\_FREQUENCY}$) to Average(Minima$_{HIGHER\_FREQUENCY}$). This low-frequency to high-frequency ratio provides an indication of whether or not there exists an arc fault. As such, the calculated 1150 ratio is compared to a predetermined threshold to determine 1155 whether or not there exists an arcing fault. If the ratio exceeds the threshold, then the process indicates 1160 that an arc fault is detected. Conversely, if the ratio does not exceed the threshold, then the process indicates 1165 that no arc fault is detected.

Figure 12:
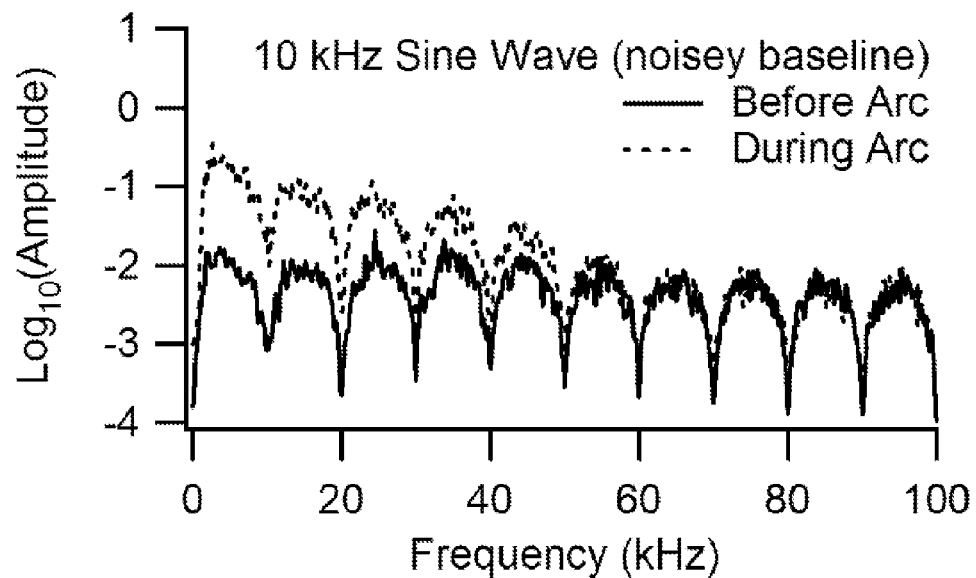
FIG. 12 is a graph showing an FFT of a modified waveform with a 100-µs delay of a synthetic 10-kHz sine wave with an arc waveform added.
Figure 13:
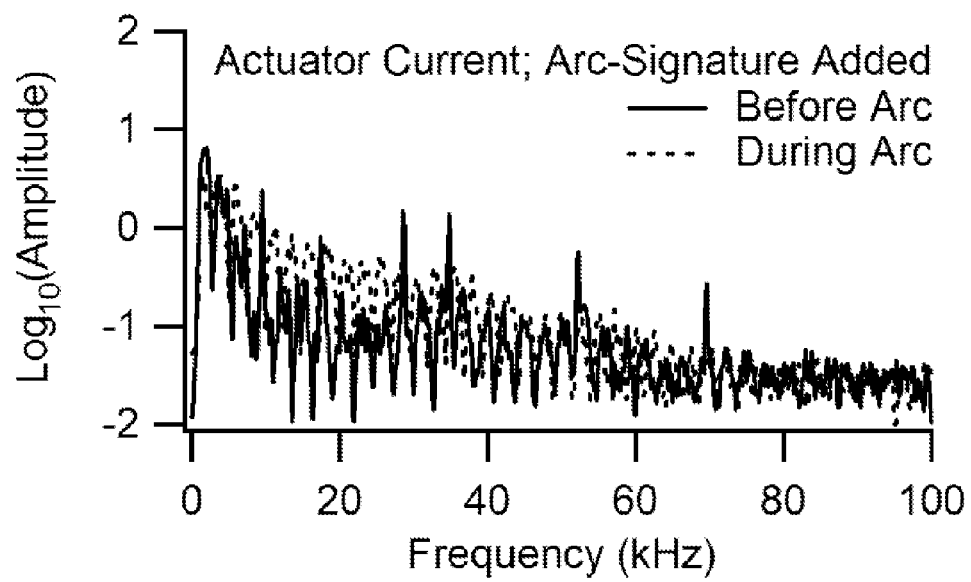
FIG. 13 is a graph showing an FFT of a modified waveform of a 110 Volt (VDC) actuator with an arc waveform added.

Having discussed one embodiment that combines one AMDF process with one frequency-domain process, attention is turned to FIG. 12, which is a graph showing an FFT of a modified waveform (with a 100-µs delay) of a synthetic 10-kHz sine wave with an arc waveform added. As noted above, if the delay period in Eq. 3 corresponds to the dominant oscillation, then minimum amplitudes will manifest themselves in the frequency spectrum of the difference waveform at integer multiples of the delay frequency. This is shown in FIG. 12. The minima in FIG. 12 represent amplitudes of residual noise at corresponding frequencies. Thus, as shown in FIG. 12, when there is no arc fault 1165 (FIG. 11B), the plot exhibits a relatively level oscillation pattern. Conversely, when an arc fault exists 1160 (FIG. 11B), the log-plot exhibits a $1/f^\beta$ type of dependence (with instrument transfer characteristics applied). Thus, a linear curve-fit may be relatively simple. Unfortunately, in practical situations, the waveform may be much more complex, as can be seen in FIG. 13, which shows an FFT of a modified waveform of a 110 Volt (VDC) actuator with an arc waveform added. Specifically, the graph of FIG. 13 represents a waveform that was recorded on an actuator system subject to a realistic load profile on a load station in a laboratory. Despite the complexity, even FIG. 13 shows a noticeable increase in the minima in the pass-band (e.g., 1.5-kHz to 45-kHz) when an arc fault is present as compared to when no arc fault is present.

Figure 14A:
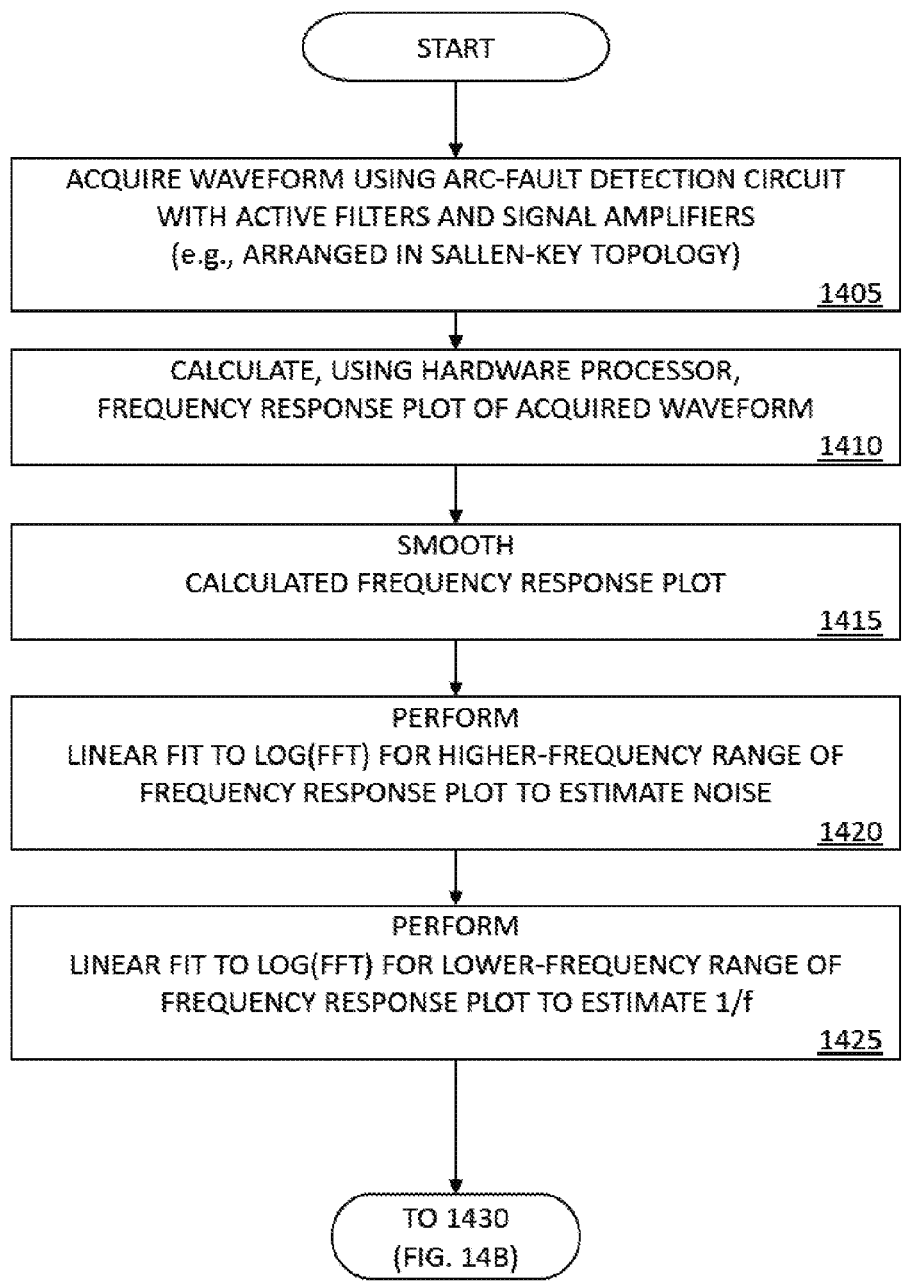
FIGS. 14A and 14B show a flowchart of yet another embodiment of a method for detecting an arc fault.
Figure 14B:
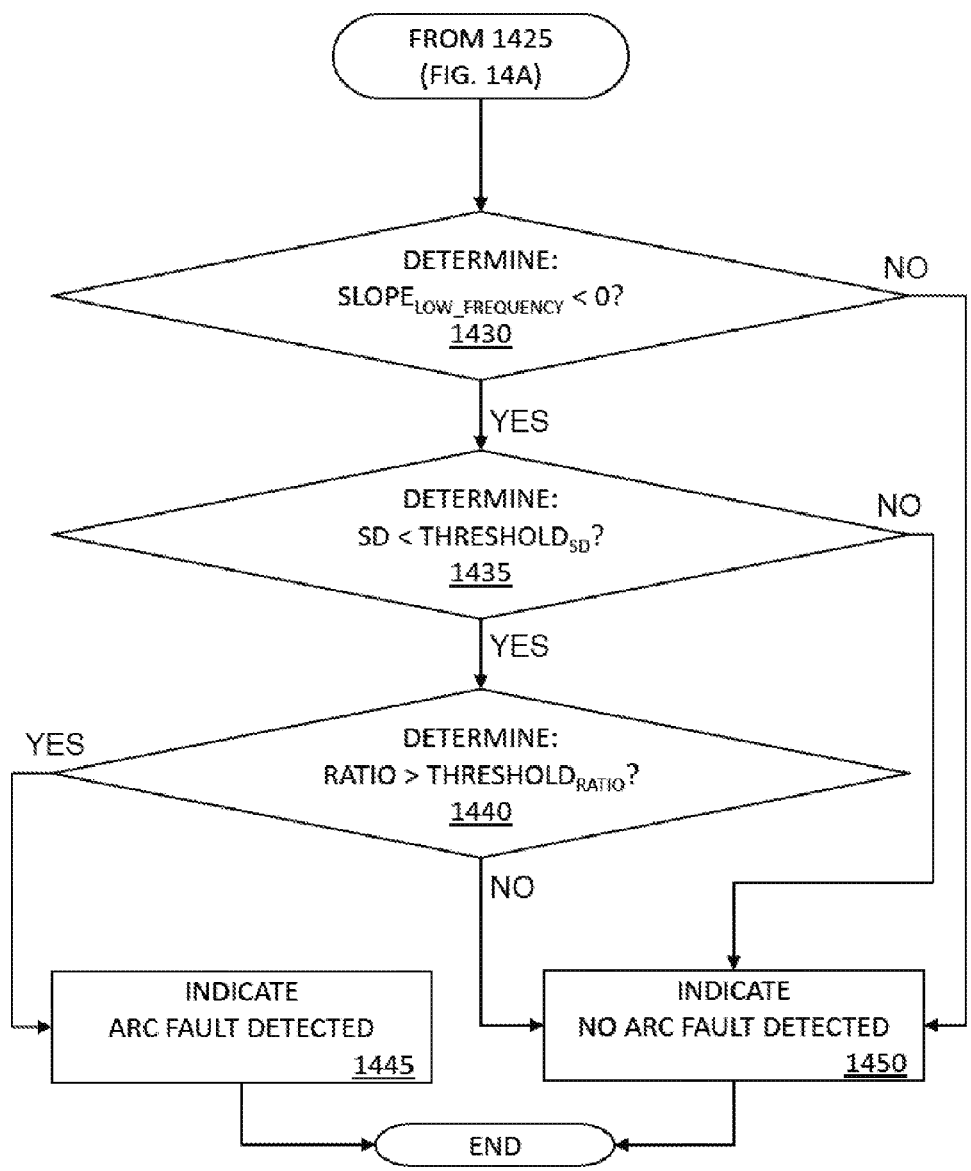

With this in mind, it should be noted that the frequency-response analysis of FIG. 9 can be altered to produce yet another embodiment of an arc-fault-detection process, as shown in the flowchart of FIGS. 14A and 14B. As shown in FIG. 14A, this embodiment of the process begins, again, with the acquisition 1405 of a waveform from the system that is under observation (e.g., brushless DC motor, etc.). Once the waveform is acquired 1405, the process calculates 1410 a frequency response plot of the acquired 1405 waveform, which is then smoothed 1415 using, for example a ±2-point or ±4-point smoothing function.

Using the smoothed 1415 frequency-response plot, a linear fit is performed 1420 on a logarithm of the higher-frequency range of the frequency-response plot. When the higher-frequency range is significantly beyond the pass-band of the system under observation, this linear fit provides an estimate of the acquisition-system baseline noise. The process also performs 1425 a linear fit to the logarithm of the lower-frequency range to estimate a 1/f distribution. As noted before, the lower-frequency range, which is within the pass-band of the system under observation, is used to determine whether or not an arc fault is present.

With all of the linear fits performed 1420, 1425, the process continues to FIG. 14B, which provides indicators for whether or not arcing faults are detected in the system. The process determines 1430 whether or not the slope of the lower-frequency range (or pass-band range) is less-than zero (0). Recalling that a 1/f-dependent slope is indicative of an arc fault, if the process determines 1430 that the slope is not less-than zero, then the process indicates 1450 that an arc fault is not detectible. However, if the process determines 1430 that the slope is less than zero, then this is an indication that an arc fault is possibly present.

Thus, the process proceeds to determine 1435 whether or not the standard deviation (SD) of the logarithm of the frequency-response plot (e.g., Log$_{10}$(FFT)) from the linear fit is less than a predetermined threshold (designated as threshold$_{SD}$). This is because the SD is a measure of the ability of the frequency-response plot to follow a 1/f-dependent relationship. Thus, if the process determines 1435 that the SD<threshold$_{SD}$, then the process indicates 1450 that an arc fault is detectible. Conversely, if the process determines 1435 that the SD≥threshold$_{SD}$, then this is an indication that an arc-fault is not detectible.

Thus, the process proceeds to determine 1440 whether ratio of the FFT value calculated from the linear fit at a chosen frequency within the pass-band to the calculated value outside of the pass-band exceeds a predetermined threshold (designated as threshold$_{RATIO}$). As explained in detail above, the ratio of the two calculated amplitudes provides an indication of whether or not an arcing fault is present. Thus, if the process determines 1440 that the amplitude ratio is not greater than threshold$_{RATIO}$, then the process indicates 1450 that no arc fault is detected, and the process ends. However, if the process determines 1440 that the amplitude ratio is greater than threshold$_{RATIO}$, then the process has now determined that: (a) the low-frequency slope (within the pass-band) is less-than zero, which is indicative that an arc fault is detectible; (b) the SD of a linear curve-fit to the Log$_{10}$(FFT)<threshold$_{SD}$, which is indicative that detection of an arc fault is possible; and (c) the amplitude ratio is greater than threshold$_{RATIO}$, which completes the indication of the presence of an arc fault. Thus, at this point, the process indicates 1445 that an arc fault is detected.

Having described in detail the various embodiments of the inventive arc-fault detection mechanisms, it is worthwhile to note how the disclosed embodiments overcome the deficiencies of other systems and methods for arc-fault detection.

Non-electrical methods include:

(1) chemical detection of arc byproducts, such as those described by J. P. Steiner in "Partial Discharge—Part IV: Commercial PD Testing," IEEE Electrical Insulation Magazine 7, 20 (1991);

(2) thermal detection of a hot arcing site, such as those described by H. B. Land, III, "Sensing Switchboard Arc Faults," IEEE Power Eng. Rev. 22, 18-20, 27 (April 2002);

(3) optical detection of visible emission, as described in J. J. Shea and R. N. Parry, "System for Eliminating Arc Faults and Power Distribution System Employing the Same," U.S. Pat. No. 7,145,757 (December 2006), R. J. Cuggiano, T. Asoken, S. M. Ungarala, and G. W. Roscoe, "Arc Detection System and Method," U.S. Pat. No. 7,580,232 (August 2009), H. B. Land and K. R. Fowler, "Sensor for Detection Arcing Faults," U.S. Pat. No. 7,536,914 (May 2009); H. B. Land and K. R. Fowler, "Sensor for Detection of Arcing Faults," U.S. Patent Publication Number 2009019301 (August 2009), D. Aihua, Y. Qiongfang, L. Hui, and Z. Dezhong, "Study on Electric Arc's On-Line Detection and Warning System for Low Voltage Distribution Box," in 2010 Second International Conference on Advanced Computer Control (ICACC) (Shenyang, China, 27-29 Mar. 2010), p. 253, L. Kumpulainen and S. Dahl, "Minimizing Hazard to Personnel, Damage to Equipment, and Process Outages by Optical Arc-Flash Protection," in 2010 Conference Record of Petroleum and Chemical Industry Conference (PCIC) Europe (Oslo, Norway, 15-17 Jun. 2010), p. 1, G. Roscoe, M. E. Valdes, and R. Luna, "Methods for Arc-Flash Detection in Electrical Equipment," in 2010 Record of Conference Papers Industry Applications Society 57th Annual Petroleum and Chemical Industry Conference (PCIC) (San Antonio, Tex., 20-22 Sep. 2010), pp. 1-8, and M. Zeller and G. Scheer, "Add Trip Security to Arc-Flash Detection for Safety and Reliability," in Conference Record, 2009 IEEE Industrial & Commercial Power Systems Technical Conference (Calgary, Canada, 3-7 May 2009) (IEEE Press, Piscataway, N.J.), pp. 1-8; and (4) acoustic detection of a pressure wave created by an arc, as described in C.-S. Maroni, R. Cittadini, Y. Cadoux, and M. Serpinet, "Series Arc Detection in Low Voltage Distribution Switchboard Using Spectral Analysis," in Proceedings of Sixth International Symposium on Signal Processing and Its Applications (B. Boashash, S. H. S. Salleh, and K. Abed-Meraim, Eds.) (Johor, Malaysia, 13-16 Aug. 2001), Vol. 2, pp. 473-476.

These chemical and thermal techniques are slow and generally indicate degrees of deterioration. Although optical and acoustic methods may be relatively rapid, they are susceptible to interference and require a degree of access to the arcing site that is often difficult to achieve. As such, the above-recited chemical, thermal, and optical methods fail to achieve comparable arc-fault detection performance when compared to the inventive embodiments disclosed herein.

Simple electrical techniques have been employed to monitor the current for higher-than-normal amplitude peaks, such as those shown by T. J. Miller and K. L. Parker, "Arc Fault Circuit Interrupter and Method of Detecting an Arc Fault," U.S. Patent Publication Number 2006/0072256 (April 2006) and F. J. Potter, "Arc Detection Circuit," U.S. Pat. No. 7,636,225 (December 2009). Additionally, monitoring of a predetermined rate of unexpected amplitude bursts has been shown by K. W. Kawate and C. V. Pellon, "Arc Detection Apparatus and Method," U.S. Pat. No. 6,980,407 (December 2005) and C. F. Renn and W. J. Koeller, "Arc Detector for Electric Rod Furnace," U.S. Pat. No. 4,376,243 (March 1983). However, these simple electrical methods cannot overcome the primary challenge of differentiating between an arcing condition and other normal activities of an electrical circuit. For example, one ambiguity is caused by a DC/DC voltage converter which can cause large periodic current spikes to appear on a circuit. Unlike the embodiments of the invention disclosed herein, none of these simple electrical approaches is capable of reliably distinguishing an arc fault from normal electrical conditions.

Slightly-more complicated systems have been described in C. Restrepo and J. Henson, "Systems, Devices, and Methods for Detecting Arcs," U.S. Pat. No. 7,110,864 (September 2006), J. C. Zuercher and D. L. McClanahan, "Apparatus and Method for Real Time Determination of Arc Fault Energy, Location, and Type," U.S. Pat. No. 7,068,045 (June 2006), and R. Chu, "Arc Fault Circuit Interrupter," U.S. Patent Publication Number 2005/0254187 (November 2005). These systems check for distortion of the power waveform by monitoring power bursts or non-repeatability in the power waveform. Again, however, these time-domain electrical techniques are based upon the characteristic of sudden onset of arc current or repetitive polarity reversal and generally suffer from limited discrimination between an arc and other normal, non-arcing events. In other words, these time-domain electrical techniques cannot discriminate between arcing events and non-arcing events as reliably as the inventive embodiments disclosed herein.

Because an arc is a non-linear load, an alternative technique for detecting its presence in a circuit involves monitoring for non-linearity. This characteristic can be manifested in AC systems by a change in the phase angle of the current-voltage relationship, such as those described by G. Parise, L. Martirano, and T. Gammon, "Simplified Arc Fault Model; The Gearing Pace Model," in Proceedings IEEE Industrial and Commercial Power Systems Technical Conference (Clearwater Beach, Fla., 2-6 May 2004) (IEEE Press, Piscataway, N.J., 2004), pp. 154-162, V. V. Deshpande and P. K. Prabhu, "Arc Fault Detection and Confirmation Using Voltage and Current Analysis," U.S. Patent Publication Number 2006/0215335 (September 2006), and D. Bak, S.-J. Lee, S.-H. Kang, M.-S. Choi, and W. Rebizant, "3DPPS for Early Detection of Arcing Faults," in 2010 Proceedings of the International Symposium on Modern Electric Power Systems (MEPS) (Wroclaw, Poland, 20-22 Sep. 2010), pp. 1-6. Alternatively, the non-linearity can be manifested through an alteration of the harmonic content of the current, as shown by J. H. Rogers, P. LaRue, D. A. Phelps, and R. I. Pinsker, "RF Arc Detection Using Harmonic Signals," in Fusion Engineering, 1995. SOFE '95— Seeking a New Energy Era, 16th IEEE/NPSS Symposium (Champaign, Ill., 30 Sep.-5 Oct. 1995) (IEEE Press, Piscataway, N.J., 1995), Vol. 1, pp. 522-525, C. Rivers, Jr., A. Adeleye, and M. Tardif, "Series Arc Detection," U.S. Pat. No. 7,062,388 (June 2006), and W-J. Lee, K. Methaprayoon, C. Kwan, Z. Ren, and J. M. Sheeley, "A Novel Approach for Arcing Fault Detection for Medium-/Low-Voltage Switchgear," IEEE Trans. Ind. Appl. 45, 1475 (July/August 2009). However, the degree of non-linearity is dependent upon frequency, and the differential conductivity varies from negative to positive as frequency increases. Also, many normal loads are non-linear. Due to difficulty in separating arc characteristics from normal-load characteristics, even these non-linear approaches are more susceptible to error than the inventive embodiments disclosed herein.

Frequency-domain techniques have also been applied extensively to arc-fault detection. Such methods include simply monitoring for bursts at particular frequencies via filter or FFT operations, such as those described by J. A. Momoh and R. Button, "Design and Analysis of Aerospace DC Arcing Faults Using Fast Fourier Transformation and Artificial Neural Network," in Proceedings, Power Engineering Society General Meeting, 2003 (Toronto, Canada, 13-17 Jul. 2003) (IEEE Press, Piscataway, N.J., 2003), Vol. 2, pp. 788-793, C. R. Dollar II, "Motorized Machine Electrical System Arc Detection Apparatus and Method," U.S. Pat. No. 6,567,759 (May 2003), M. Vaughan and P. J. Moore, "A Nonintrusive Power System Arcing Fault Location System Utilising the VLF Radiated Electromagnetic Energy," in Proceedings Power Engineering Society Winter Meeting (Singapore, 23-27 January 200) (IEEE Press, Piscataway, N.J., 2000), Vol. 4, pp. 2443-2448, C. R. Dollar, II, "Vehicle Electrical System Arc Detection Apparatus and Method," U.S. Patent Publication Number 2002/0179346 (December 2002), C. R. Dollar II, "Direct Current Electrical System Arc Detection Apparatus and Method," U.S. Pat. No. 6,633,824 (October 2003), C-Y. Kim, D-S. Kim, J-M. Ko, and J-C. Moon, "Apparatus for Detecting Arc Fault," U.S. Pat. No. 7,106,069 (September 2006), F. Schimpf and L. E. Norum, "Recognition of Electric Arcing in the DC-Wiring of Photovoltaic Systems," in 31 st International Telecommunications Energy Conference (INTELEC 2009) (Incheon, Korea, 18-22 Oct. 2009), pp. 1-6, J. Henson and C. Restrepo, "Devices, Systems, and Methods for Adaptive RF Sensing in Arc Fault Detection," U.S. Pat. No. 7,463,037 (December 2008), and W. E. Beatty, D. J. Carolan, and X. Zhou, "Industrial Arc Fault Circuit Interruptor and Method of Detecting Arcing Conditions," U.S. Pat. No. 7,570,465 (August 2009).

Others have used frequency-domain techniques for monitoring a broad band of frequencies, such as, for example, F. K. Blades, "Method and Apparatus for Detecting Arcing in AC Power Systems by Monitoring High Frequency Noise," U.S. Pat. No. 5,729,145 (March 1998), B. F. Macbeth, T. N. Packard, J. C. Richards, and J. P. Romano, "Arc Fault Circuit Interrupter Recognizing Arc Noise Burst Patterns," U.S. Pat. No. 6,893,208 (January 2005), A. A. Haun, A. G. Coats, K. B. Wong, R. F. Dvorak, and G. W. Scott, "Arc Fault Detection System." U.S. Pat. No. 6,259,996 (July 2001), K. B. Wong and G. W. Scott, "Arc Detection Using Load Recognition, Harmonic Content and Broadband Noise," U.S. Pat. No. 7,068,480 (June 2006). K. W. Kawate and C. V. Pellon, "Arc Detection Apparatus and Method," U.S. Pat. No. 6,980,407 (December 2005), C. V. Pellon, M. J. Lavado, and J. B. Ting, "Methods of Detecting Arc Faults Characterized by Consecutive Periods of Arcing," U.S. Patent Publication Number 2006/0181816 (August 2006), R. T. Elms, K. L. Parker, and J. C. Zuercher, "Arc Fault Circuit Interrupter," U.S. Patent Publication Number 2006/0018060 (January 2006), P. H. Czanky, M. R. Ferino, and I. M. Bordignon, "Arc Fault Detection System," U.S. Pat. No. 7,038,897 (May 2006), M. Naidu, T. Schoepf, and S. Gopalakrishnan, "Arc Fault Detection Scheme for 42-V Automotive DC Networks Using Current Shunt," IEEE Trans. Power Elect. 21, 633-639 (2006), and M. Naidu, T. Schoepf, and S. Gopalakrishnan, "Arc Fault Detector and Method," U.S. Pat. No. 7,009,406 (March 2006).

More sophisticated frequency-based techniques that recognize the random-broadband nature of an arc have been employed by others, such as J. Li and J. L. Kohler, "New Insight into the Detection of High-Impedance Arcing Faults on DC Trolley Systems," IEEE Trans. Ind. Appl. 35, 1169-1173 (1999), and C. L. Hale, R. M. Hornsby, J. M. Maxwell, and C. R. Schwartz, "System and Method for Remotely Detecting Electric Arc Events in a Power System," U.S. Pat. No. 6,943,558 (September 2005). However, these frequency-domain techniques still fail to achieve a level of reliability that can be achieved by the inventive embodiments disclosed herein.

Time-frequency-domain analysis, through the application of wavelet techniques has been suggested as an arc-detection method by W. Charytoniuk, E-J. Li, M-S. Chen, J. Cultera, and T. Maffertone, "Arcing Fault Detection in Underground Distribution Networks-Feasibility Study," IEEE Trans. Ind. Appl. 36, 1756-1761 (2000), W-J. Li and Y-C. Li, "Arc Fault Detection Based on Wavelet Packet," in Machine Learning and Cybernetics, 2005, Proceedings of the 2005 International Conference on Machine Learning and Cybernetics (Guangzhou, China, 18-21 Aug. 2005) (IEEE Press, Piscataway, N.J., 2005), Vol. 3, pp. 1783-1788, G. Yunmei, W. Li, W. Zhuoqi, and J. Binfeng, "Wavelet Packet Analysis Applied in Detection of Low-voltage DC Arc Fault," in 4th IEEE Conference on Industrial Electronics and Applications (ICIEA 2009) (Xi'an, China, 25-27 May 2009) (IEEE Press, Piscataway, N.J., 2009), p. 4013, S. Ma and L. Guan, "Arc-Fault Recognition Based on BP Neural Network," in 2011 Third International Conference on Measuring Technology and Mechatronics Automation (Shangshai, China, 6-7 Jan. 2011) (IEEE Press, Piscataway, N.J., 2011), p. 584, and E. S. T. Eldin, D. K. Ibrahim, E. M. Aboul-Zahab, and S. M. Saleh, "High Impedance Fault Detection in EHV Series Compensated Lines Using The Wavelet Transform," in IEEE/PES Power Systems Conference and Exposition, (PSCE '09) (Seattle, Wash., 15-18 Mar. 2000) (IEEE Press. Piscatasway, N.J., 2009), pp. 1-10. However, the degree of success in these wavelet-based techniques is highly dependent upon the choice of wavelet families as well as the wave shapes of the arc current, which, in turn, are dependent upon arc conditions such as operating current levels and materials that are in contact with the arc. Those deficiencies are not present in the inventive embodiments disclosed herein.

Others, as shown in C. Hong, C. Xiaojuan, L. Fangyun, and W. Cong, "Series Arc Fault Detection and Implementation Based on The Short-time Fourier Transform," in 2010 Asia-Pacific Power and Energy Engineering Conference (APPEEC) (Chengdu, China, 28-31 Mar. 2010) (IEEE Press, Piscataway, N.J., 2010), pp. 1-4, have employed time-frequency-domain technique involving the application of the short-time Fourier transform (STFT). Both wavelet and STFT calculations require a high level of data processing, which places space and economic constraints on a detection system. Again, the inventive embodiments are not restricted to the same space and economic constraints as those of the STFT and wavelet systems.

As one can see, none of these time-domain, frequency-domain, wavelet, or STFT processes is comparable to the reliability and performance of the disclosed inventive embodiments.

With all of this in mind, it should be appreciated that the arc-fault-detection algorithms described with reference to FIGS. 6A, 6B, 9, 11A, 11B, 14A, and 14B may be implemented in hardware, software, firmware, or a combination thereof. In the preferred embodiment(s), the arc-fault-detection algorithms are implemented in hardware using any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In an alternative embodiment, the arc-fault-detection algorithms are implemented in software or firmware that is stored in a memory and that is executed by a suitable instruction execution system.

The flowcharts of FIGS. 6A, 6B, 9, 11A, 11B, 14A, and 14B show the architecture, functionality, and operation of a possible implementation of the arc-fault-detection algorithms. In this regard, each block represents a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved. Thus, any process descriptions or blocks in flow charts should be understood as representing modules, segments, or portions of code which include one or more executable instructions for implementing specific logical functions or steps in the process, and alternate implementations are included within the scope of the preferred embodiment of the present disclosure in which functions may be executed out of order from that shown or discussed, including substantially concurrently or in reverse order, depending on the functionality involved, as would be understood by those reasonably skilled in the art of the present disclosure.

Each of the algorithms for detecting arc faults, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured via, for instance, optical scanning of the paper or other medium, then compiled, interpreted or otherwise processed in a suitable manner if necessary, and then stored in a computer memory.

Although exemplary embodiments have been shown and described, it will be clear to those of ordinary skill in the art that a number of changes, modifications, or alterations to the disclosure as described may be made. For example, while several examples of processors and numeric values have been provided in order to more-clearly describe the inventive embodiments, it should be appreciated by one having ordinary skill in the art that other processors and numeric values may be used in lieu of those that have been specified herein. Furthermore, while some threshold values (e.g., 5-mA) have been used as example threshold values, it should be appreciated that the threshold values are dependent on the system that is under observation. As such, the threshold values that are used for arc-fault detection are system-dependent, and one having ordinary skill in the art will understand how to judiciously select those threshold values as a function of the system characteristics. For this reason, some threshold values (e.g., 5-mA) are recited herein, but other specific threshold values are not specifically enumerated. It should be understood that the time delay ($\tau$ and $\delta$) could be either forward or backward in time. That is, t=0 could be the last digitized point of a waveform and time delay would progress backward in time toward the first digitized point, or t=0 could be considered the first digitized point of a waveform and delay progress toward the last point. These, and all other such changes, modifications, and alterations should therefore be seen as being within the scope of the disclosure.

What is claimed is:

1. A method comprising:
acquiring a first waveform using an arc-fault detection circuit having active filters and signal amplifiers;
determining, using a hardware processor, a first Average Magnitude Different Function (AMDF) of the first waveform acquired using the arc-fault detection circuit;
locating a first minimum peak of the first AMDF; and
determining whether an arc fault is detected as a function of the first minimum peak.

2. The method of claim 1, further comprising:
deriving a modified waveform by applying a time-delay to the first waveform;
calculating a frequency-response plot of the modified waveform;
calculating a high frequency minima in a high-frequency range of the frequency-response plot, the high-frequency range being outside of a pass-band of the arc-fault detection circuit;
calculating a low-frequency minima in a low-frequency range of the frequency-response plot, the low-frequency range being within the pass-band of the arc-fault detection circuit;
calculating a ratio of the low-frequency minima to the high-frequency minima; and
determining whether the arc fault is detected as a function of the calculated ratio.

3. The method of claim 2, calculating the frequency-response plot, comprising:
performing a Fast Fourier Transform (FFT) on the modified waveform.

4. The method of claim 3, further comprising
smoothing the FFT.

5. The method of claim 1, wherein acquiring the first waveform comprises acquiring the first waveform using an arc-fault detection circuit having active filters and signal amplifiers arranged in a Sallen-Key topology.

6. A method comprising:
acquiring a first waveform using an arc-fault detection circuit having active filters and signal amplifiers;

calculating, using a hardware processor, a frequency-response plot of the waveform acquired using the arc-fault detection circuit;

estimating a noise amplitude in a high-frequency range of the frequency-response plot, the high-frequency range being outside of a pass-band of the arc-fault detection circuit, the noise amplitude being estimated by performing a first curve fit of a high-frequency range;

performing a second curve fit of a low-frequency range to a function to calculate an amplitude in the low-frequency range, the low-frequency range being within the pass-band of the arc-fault detection circuit, the function being $1/f^\beta$-dependent, where:

$0<\beta<2$; and determining whether an arc fault is detected based on a ratio of the noise amplitude in the high-frequency range and the amplitude in the low-frequency range.

7. The method of claim 6, estimating the noise comprising:
generating a logarithm of the frequency-response plot;
performing a first linear curve fit on the high-frequency range of the logarithm of the frequency-response plot, the first linear curve fit producing a first value at a first selected frequency.

8. The method of claim 7, performing the second curve fit comprising:
performing a second linear curve fit on the low-frequency range of the logarithm of the frequency-response plot, the second linear curve fit producing a slope and a second value at a second selected frequency.

9. The method of claim 8, determining whether the arc fault is detected comprising:
calculating a ratio of the second value to the first value.

10. The method of claim 9, further comprising:
determining whether the calculated ratio exceeds a predetermined threshold; and
indicating that the arc fault is detected in response to the ratio exceeding the predetermined threshold.

11. The method of claim 8, further comprising:
determining whether the slope is less than zero; and
indicating that the arc fault is detected in response to the slope being less than zero.

12. The method of claim 11, further comprising:
determining whether a standard deviation (SD) of the second curve fit is less than a predetermined SD-threshold ($threshold_{SD}$); and
indicating that the arc fault is detected in response to the SD being less than $threshold_{SD}$.

13. The method of claim 12, further comprising:
calculating a ratio of the second value to the first value;
determining whether the calculated ratio exceeds a predetermined ratio threshold ($threshold_{RATIO}$); and
indicating that no arc fault is detected in response to the ratio not exceeding $threshold_{RATIO}$.

14. The method of claim 13, further comprising:
indicating that the arc fault is detected in response to:
the slope being less than zero;
the SD being less than $threshold_{SD}$; and
the ratio exceeding $threshold_{RATIO}$.

15. The method of claim 7, calculating the frequency-response plot comprising:
performing a Fast Fourier Transform (FFT) on the waveform.

16. The method of claim 15, further comprising:
smoothing the FFT.

17. The method of claim 6, wherein acquiring the first waveform comprises acquiring the first waveform using an arc-fault detection circuit having active filters and signal amplifiers arranged in a Sallen-Key topology.

* * * * *